US009581904B2

(12) United States Patent
Lee et al.

(10) Patent No.: US 9,581,904 B2
(45) Date of Patent: Feb. 28, 2017

(54) PHOTORESIST OVERCOAT COMPOSITIONS

(71) Applicant: Rohm and Haas Electronic Materials LLC, Marlborough, MA (US)

(72) Inventors: Choong-Bong Lee, Westborough, MA (US); Stefan J. Caporale, Marlborough, MA (US); Jason A. DeSisto, Bellingham, MA (US); Jong Keun Park, Shrewsbury, MA (US); Cong Liu, Shrewsbury, MA (US); Cheng-Bai Xu, Southborough, MA (US); Cecily Andes, Newton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/927,357

(22) Filed: Oct. 29, 2015

(65) Prior Publication Data

US 2016/0122574 A1    May 5, 2016

Related U.S. Application Data

(60) Provisional application No. 62/073,935, filed on Oct. 31, 2014.

(51) Int. Cl.
| | |
|---|---|
| *G03F 7/039* | (2006.01) |
| *G03F 7/38* | (2006.01) |
| *G03F 7/11* | (2006.01) |
| *G03F 7/004* | (2006.01) |
| *G03F 7/075* | (2006.01) |
| *G03F 7/09* | (2006.01) |
| *G03F 7/20* | (2006.01) |
| *C09D 4/06* | (2006.01) |
| *C09D 133/06* | (2006.01) |

(52) U.S. Cl.
CPC .......... *G03F 7/11* (2013.01); *C09D 4/06* (2013.01); *G03F 7/0046* (2013.01); *G03F 7/0752* (2013.01); *G03F 7/091* (2013.01); *G03F 7/2041* (2013.01); *C09D 133/06* (2013.01)

(58) Field of Classification Search
CPC .................................. G03F 7/039; G03F 7/38
USPC ......................................... 430/283.1; 524/520
See application file for complete search history.

(56) References Cited

U.S. PATENT DOCUMENTS

| | | |
|---|---|---|
| 5,599,650 A | 2/1997 | Bi et al. |
| 6,764,806 B2 | 7/2004 | Jung et al. |
| 8,241,832 B2 | 8/2012 | Wang et al. |
| 8,921,031 B2 | 12/2014 | Bae et al. |
| 9,128,379 B2 | 9/2015 | Bae et al. |
| 2005/0250898 A1 | 11/2005 | Maeda et al. |
| 2006/0029884 A1 | 2/2006 | Hatakeyama et al. |
| 2006/0046184 A1 | 3/2006 | Jung et al. |
| 2007/0275326 A1 | 11/2007 | Hatakeyama et al. |
| 2008/0102405 A1 | 5/2008 | Watanabe et al. |
| 2008/0193879 A1* | 8/2008 | Allen .................... C08F 220/22 430/285.1 |
| 2008/0286687 A1 | 11/2008 | Endo et al. |
| 2009/0239176 A1 | 9/2009 | Kanda |
| 2009/0280431 A1 | 11/2009 | Hirano et al. |
| 2010/0136486 A1 | 6/2010 | Harada et al. |
| 2011/0020755 A1 | 1/2011 | Tsubaki |
| 2011/0294069 A1* | 12/2011 | Bae ....................... G03F 7/0392 430/283.1 |
| 2014/0038102 A1 | 2/2014 | Park et al. |
| 2015/0185607 A1 | 7/2015 | Park et al. |
| 2015/0185615 A1 | 7/2015 | Park et al. |

FOREIGN PATENT DOCUMENTS

| | | |
|---|---|---|
| JP | 2002035684 A | 2/2002 |
| JP | 2014056194 A | 3/2014 |
| WO | 2010061977 A2 | 6/2010 |

OTHER PUBLICATIONS

Co-Pending U.S. Appl. No. 14/927,354, filed Oct. 29, 2015.
Search report from corresponding Taiwan Application No. 104135277 dated Apr. 22, 2016.

* cited by examiner

*Primary Examiner* — Jim J Seidleck
*Assistant Examiner* — Deve E Valdez
(74) *Attorney, Agent, or Firm* — Jonathan D. Baskin

(57) ABSTRACT

Photoresist overcoat compositions are provided. The compositions comprise: a matrix polymer, an additive polymer a basic quencher and an organic solvent. The additive polymer has a lower surface energy than a surface energy of the matrix polymer, and the additive polymer is present in the overcoat composition in an amount of from 1 to 20 wt % based on total solids of the overcoat composition. The compositions have particular applicability in the semiconductor manufacturing industry for use in negative tone development processes.

19 Claims, 1 Drawing Sheet

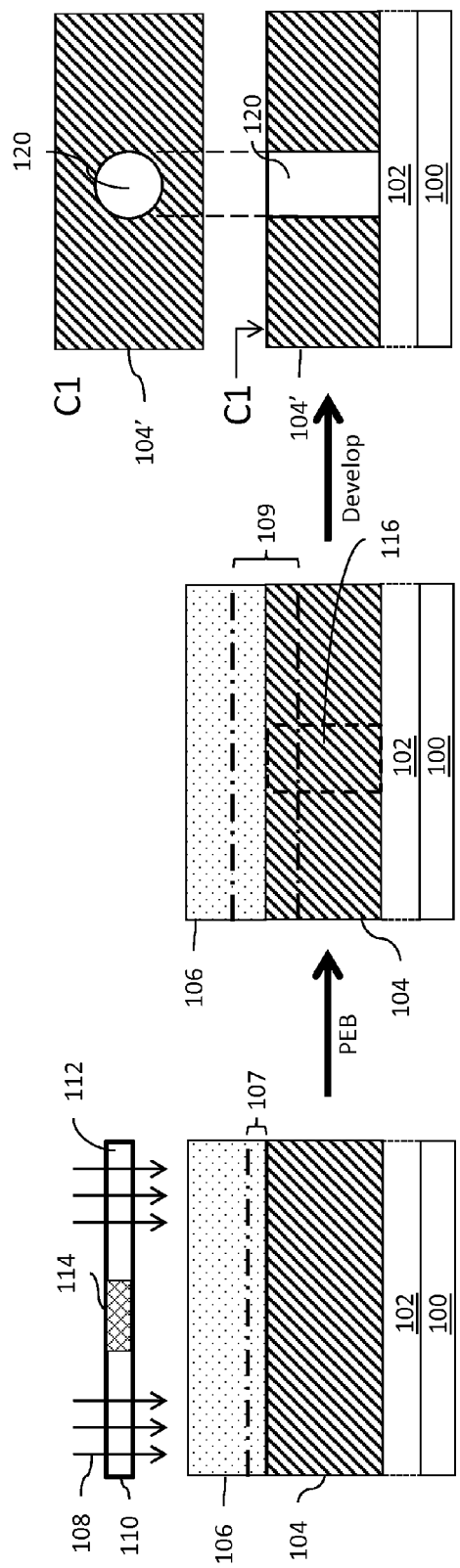

PHOTORESIST OVERCOAT COMPOSITIONS

This application claims the benefit of priority under 35 U.S.C. §119(e) to U.S. Provisional Application No. 62/073,935, filed Oct. 31, 2014, the entire contents of which are incorporated herein by reference.

BACKGROUND

The invention relates generally to the manufacture of electronic devices. More specifically, this invention relates to photoresist overcoat compositions useful in photolithographic methods which allow for the formation of fine patterns using a negative tone development process.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing using a positive tone development (PTD) process. In the PTD process, exposed regions of a photoresist layer become soluble in a developer solution, typically an aqueous alkaline developer, and are removed from the substrate surface, whereas unexposed regions which are insoluble in the developer remain after development to form a positive image. To improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer.

Considerable effort has been made to extend the practical resolution beyond that achieved with positive tone development from both a materials and processing standpoint. One such example is the negative tone development (NTD) process. The NTD process allows for improved resolution and process window as compared with standard positive tone imaging by making use of the superior imaging quality obtained with bright field masks for printing critical dark field layers. NTD resists typically employ a resin having acid-labile (also referred to herein as acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by organic solvent developers, leaving behind a pattern created by the insoluble exposed regions.

Problems in NTD processing in the form of necking of contact holes and T-topping of line and trench patterns in the developed resist patterns are known and described in U.S. Application Pub. No. US2013/0244438A1. Such problems are believed to be caused by diffusion of stray light beneath edges of the photomask opaque pattern, undesirably causing polarity-switching in those "dark" regions at the resist surface. In an effort to address this problem, the '438 publication discloses use of a photoresist overcoat that includes a basic quencher, a polymer and an organic solvent. For purposes of immersion lithography, the '438 publication further discloses that the overcoat compositions can be used to form a barrier layer for avoidance of leaching of photoresist components into the immersion fluid and to provide desirable contact angle characteristics with the immersion fluid for increased exposure scan speeds.

There is a continuing need in the art for improved photolithographic methods and photoresist overcoat compositions for the formation of fine patterns with improved contact angle characteristics between the substrate surface and immersion fluid which would allow for greater immersion scanner speeds.

SUMMARY OF THE INVENTION

In accordance with an aspect of the invention, photoresist overcoat compositions are provided. The compositions comprise: a matrix polymer comprising a unit formed from a monomer of the following general formula (I):

wherein: $R_1$ is chosen from hydrogen and optionally substituted C1 to C3 alkyl; $R_2$ is chosen from optionally substituted C1 to C15 alkyl; $X_1$ is oxygen, sulfur or is represented by the formula $NR_3$, wherein $R_3$ is chosen from hydrogen and optionally substituted C1 to C10 alkyl; and $Z_1$ is a single bond or a spacer unit chosen from optionally substituted aliphatic and aromatic hydrocarbons, and combinations thereof, optionally with one or more linking moiety chosen from —O—, —S—, —COO— and —CONR$_4$— wherein $R_4$ is chosen from hydrogen and optionally substituted C1 to C10 alkyl; and an additive polymer comprising a unit formed from a monomer of the following general formula (II) or (III):

wherein: $R_{10}$ is chosen from hydrogen and optionally substituted C1 to C3 alkyl; $R_{11}$ is chosen from optionally substituted C1 to C15 alkyl; $X_2$ is oxygen, sulfur or is represented by the formula $NR_{12}$, wherein $R_{12}$ is chosen from hydrogen and optionally substituted C1 to C10 alkyl; and $Z_3$ is a single bond or a spacer unit chosen from optionally substituted aliphatic and aromatic hydrocarbons, and combinations thereof, optionally with one or more linking moiety chosen from —O—, —S—, —NHSO$_2$—, —COO— and —CONR$_{13}$— wherein R$_{13}$ is chosen from hydrogen and optionally substituted C1 to C10 alkyl;

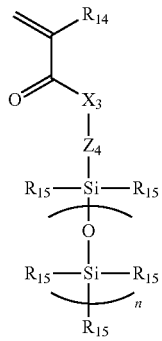

(III)

wherein: R$_{14}$ is chosen from hydrogen and optionally substituted C1 to C3 alkyl; R$_{15}$ is independently chosen from optionally substituted C1 to C15 alkyl; X$_3$ is oxygen, sulfur or is represented by the formula NR$_{16}$, wherein R$_{16}$ is chosen from hydrogen and optionally substituted C1 to C10 alkyl; Z$_4$ is a single bond or a spacer unit chosen from optionally substituted aliphatic and aromatic hydrocarbons, and combinations thereof, optionally with one or more linking moiety chosen from —O—, —S—, —COO— and —CONR$_{17}$—, wherein R$_{17}$ is chosen from hydrogen and optionally substituted C1 to C10 alkyl; and n is an integer from 0 to 2; a basic quencher; and an organic solvent; wherein the additive polymer has a lower surface energy than a surface energy of the matrix polymer, and wherein the additive polymer is present in the overcoat composition in an amount of from 1 to 20 wt % based on total solids of the overcoat composition. The compositions have particular applicability in the semiconductor manufacturing industry for use in negative tone development processes.

As used herein: "mol %" means mole percent based on the polymer, unless otherwise specified, and numbers shown with polymer units are in mol % unless otherwise specified; "Mw" means weight average molecular weight; "Mn" means number average molecular weight; "PDI" means polydispersity index=Mw/Mn; "copolymer" is inclusive of polymers containing two or more different types of polymerized units; "alkyl" and "alkylene" are inclusive of linear, branched and cyclic alkyl and alkylene structures, respectively, unless otherwise specified or indicated by context; the articles "a" and "an" are inclusive of one or more unless otherwise indicated by context; and "substituted" means having one or more hydrogen atoms replaced with one or more substituents chosen, for example, from hydroxy, fluorine and alkoxy such as C1-C5 alkoxy.

DESCRIPTION OF THE DRAWINGS

The present invention will be described with reference to the following drawings, in which like reference numerals denote like features, and in which:

FIG. 1A-C illustrates a process flow for forming a photolithographic pattern by negative tone development in accordance with the invention.

DETAILED DESCRIPTION

Photoresist Overcoat Compositions

The photoresist overcoat compositions include a matrix polymer, an additive polymer, a basic quencher and an organic solvent. The additive polymer has a lower surface energy than a surface energy of the matrix polymer. The compositions of the invention when coated over a photoresist layer in a negative tone development process can provide various benefits, such as one or more of improved contact angle characteristics with an immersion fluid, improved focus latitude, improved exposure latitude, reduced defectivity, effective barrier layer properties for avoidance of leaching of photoresist and overcoat components into an immersion fluid, geometrically uniform resist patterns and reduced reflectivity during resist exposure. The compositions can be used in dry lithography or immersion lithography processes. The exposure wavelength is not particularly limited except by the photoresist compositions, with 248 nm or sub-200 nm such as 193 nm (immersion or dry lithography) or an EUV wavelength (e.g., 13.4 nm) being typical.

The matrix polymer can with the additive polymer impart to layers formed from the overcoat compositions beneficial barrier properties to minimize or prevent migration of photoresist components into an immersion fluid. The additive polymer preferably can also prevent migration of components within the overcoat composition such as the basic quencher into an immersion fluid. Beneficial contact angle characteristics with the immersion fluid such as a high immersion fluid receding contact angle (RCA) at the overcoat/immersion fluid interface can be provided, thereby allowing for faster exposure tool scanning speeds. A layer of the overcoat composition in a dried state typically has a water receding contact angle of from 70° to 89°, preferably from 75 to 85°. The phrase "in a dried state" means containing 8 wt % or less of solvent, based on the overcoat composition.

The matrix polymer is soluble in the organic solvent of the overcoat composition, described herein. In addition, the matrix polymer should be soluble in for good developability with organic solvent developers used in negative tone development processes. To minimize residue defects originated from the overcoat materials, the dissolution rate of a dried layer of the overcoat composition is preferably greater than that of the underlying photoresist layer in the developer used in the patterning process. The matrix polymer typically exhibits a developer dissolution rate of 100 Å/second or higher, preferably 1000 Å/second or higher.

Matrix polymers useful in the overcoat compositions can be homopolymers or can be copolymers having a plurality of distinct repeat units, for example, two, three, four or more distinct repeat units. The matrix polymer can include units having polymerizable groups chosen, for example, from one or more of (alkyl)acrylate, (alkyl)acrylamide, allyl, maleimide styrene, vinyl, polycyclic (e.g., norbornene) or other group, with (alkyl)acrylate such as (meth)acrylate being preferred. The matrix polymer can be a random polymer, a block polymer, or a gradient polymer having a graded change in composition from one monomer unit-type to another monomer unit-type along the length of the polymer chain.

The matrix polymer has a higher surface energy than that of, and is preferably immiscible with, the additive polymer, to allow the additive polymer to phase separate from the matrix polymer and migrate to the upper surface of the overcoat layer. The surface energy of the matrix polymer is typically from 30 to 60 mN/m. The matrix polymer is preferably free of silicon and fluorine as these tend to decrease surface energy and can inhibit phase separation of the additive polymer from the matrix polymer.

The matrix polymer is formed from a monomer having the following general formula (I):

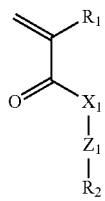

(I)

wherein: $R_1$ is chosen from hydrogen and optionally substituted C1 to C3 alkyl, preferably hydrogen or methyl; $R_2$ is chosen from optionally substituted C1 to C15 alkyl, preferably C4 to C8 alkyl, more preferably C4 to C6 alkyl; $X_1$ is oxygen, sulfur or is represented by the formula $NR_3$, wherein $R_3$ is chosen from hydrogen and optionally substituted C1 to C10 alkyl, preferably C1 to C5 alkyl; and $Z_1$ is a single bond or a spacer unit chosen from optionally substituted aliphatic (such as C1 to C6 alkylene) and aromatic hydrocarbons, and combinations thereof, optionally with one or more linking moiety chosen from —O—, —S—, —COO— and —CONR$_4$— wherein $R_4$ is chosen from hydrogen and optionally substituted C1 to C10 alkyl, preferably C2 to C6, alkyl. The monomer of general formula (I) is preferably free of silicon and fluorine. Units of general formula (I) taken together are typically present in the matrix polymer in an amount of from 50 to 100 mol %, for example, from 70 to 100 mol %, from 80 to 100 mol %, from 90 to 100 mol % or 100 mol %, based on the matrix polymer.

The monomer of general formula (I) is preferably of the following general formula (I-1):

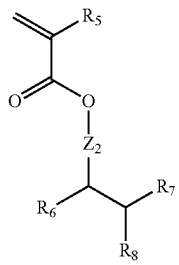

(I-1)

wherein $R_5$ is chosen from hydrogen and optionally substituted C1 to C3 alkyl, preferably hydrogen or methyl; $R_6$, $R_7$ and $R_8$ independently represent hydrogen or a $C_1$ to $C_3$ alkyl group; and $Z_2$ is a single bond or a spacer unit chosen from optionally substituted aliphatic (such as C1 to C6 alkylene) and aromatic hydrocarbons, and combinations thereof, optionally with one or more linking moiety chosen from —O—, —S—, —COO— and —CONR$_9$—, wherein $R_9$ is chosen from hydrogen and optionally substituted C1 to C10 alkyl, preferably C2 to C6, alkyl. The monomer of general formula (I-1) is preferably free of silicon and fluorine.

One or more unit of the matrix polymer can include a basic moiety. The basic moiety can neutralize acid in the regions of an underlying photoresist layer intended to be unexposed (dark region), which acid is generated by stray light in the surface region of the photoresist layer. Such a basic moiety-containing matrix polymer can function as the basic quencher in the overcoat composition in addition to or as an alternative to a basic quencher additive. Suitable moieties include, for example, a nitrogen-containing group chosen from: amines such as amino ethers, pyridines, anilines, indazoles, pyrroles, pyrazoles, pyrazines, guanidiniums and imines; amides such as carbamates, pyrrolidinones, maleimides, imidazoles and imides; and derivatives thereof. If present in the matrix polymer, the content of the basic moiety-containing unit(s) in the matrix polymer is typically sufficient to substantially or completely eliminate acid-induced deprotection reaction in the dark regions of an underlying photoresist layer while allowing such reaction to occur in the bright regions (those regions intended to be exposed) of the layer. The desired content of the basic moiety-containing unit(s) in the matrix polymer will depend, for example, on the content of the photoacid generator in the photoresist layer, and on the intended use of the overcoat, whether in a dry or immersion lithography process. If present, the content of basic moiety-containing unit(s) in the matrix polymer for a dry lithography process will typically be from 0.1 to 100 mole %, from 0.1 to 50 mole % or from 0.5 to 20 mole %, based on the matrix polymer. The pKa (in water) of the monomer containing the basic moiety is preferably from 5 to 50, more preferably from 8 to 40 and most preferably from 10 to 35. The pKa value of the basic moiety-containing monomer and the matrix polymer as a whole will typically have the same or substantially the same value.

Exemplary suitable monomers for use in forming the matrix polymer are described below, but are not limited to these structures, with "$R_1$" and "$X_1$" are as defined above:

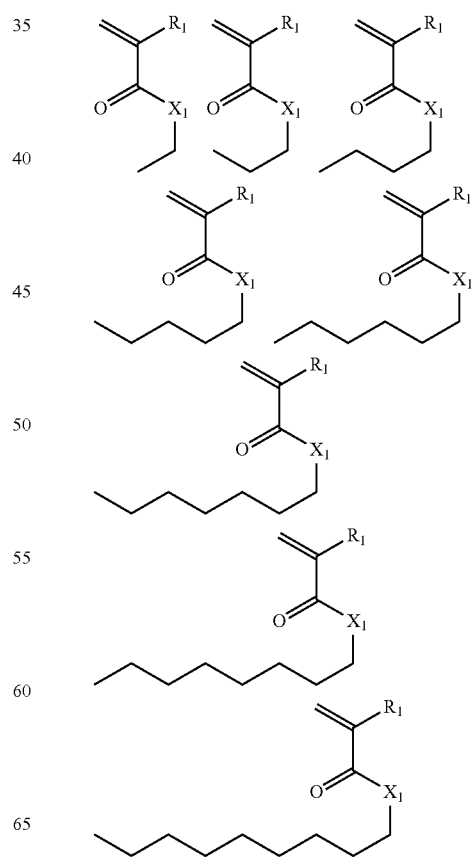

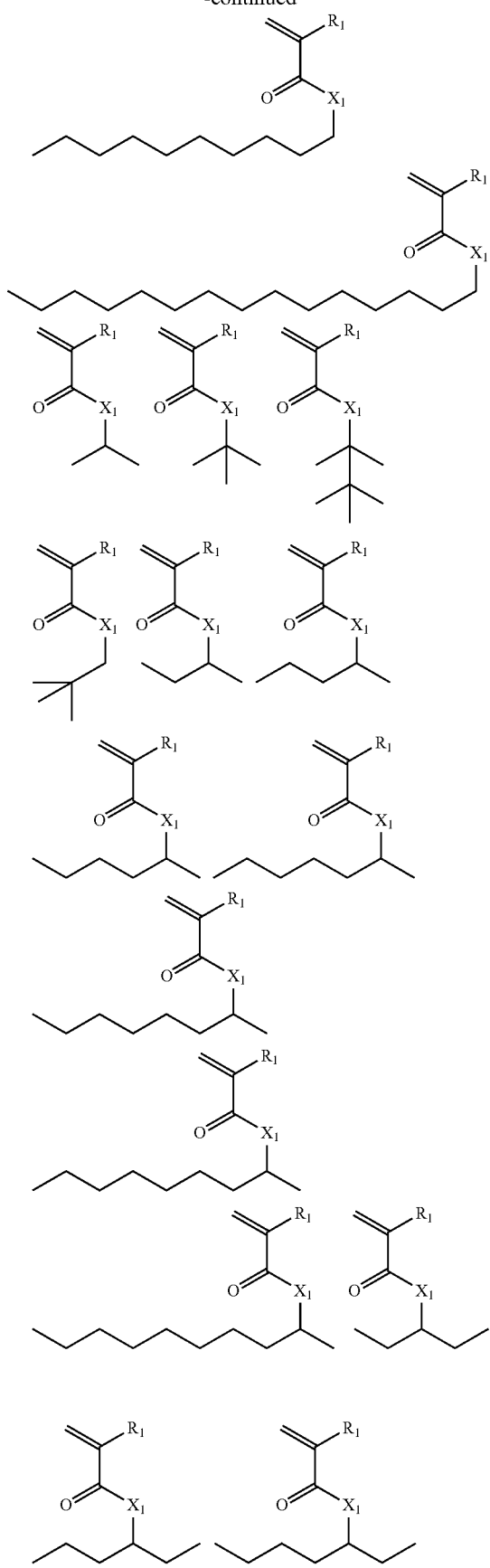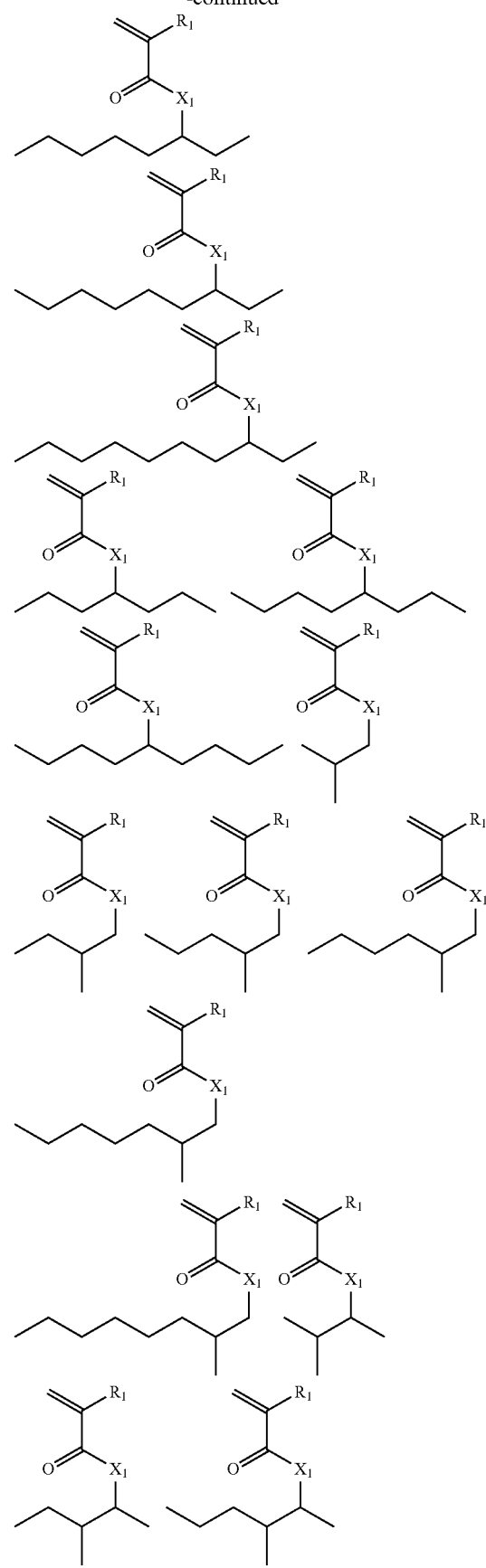

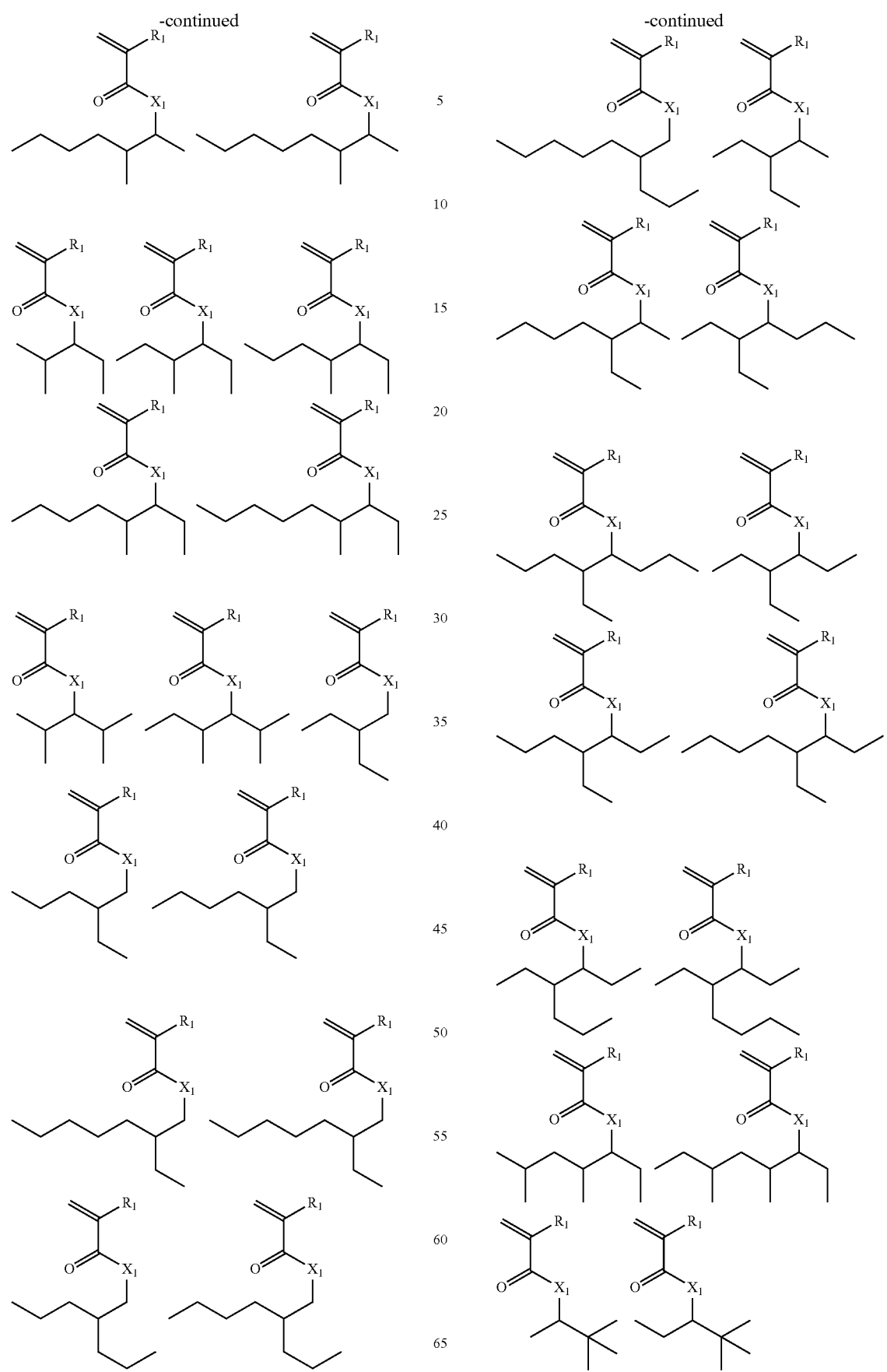

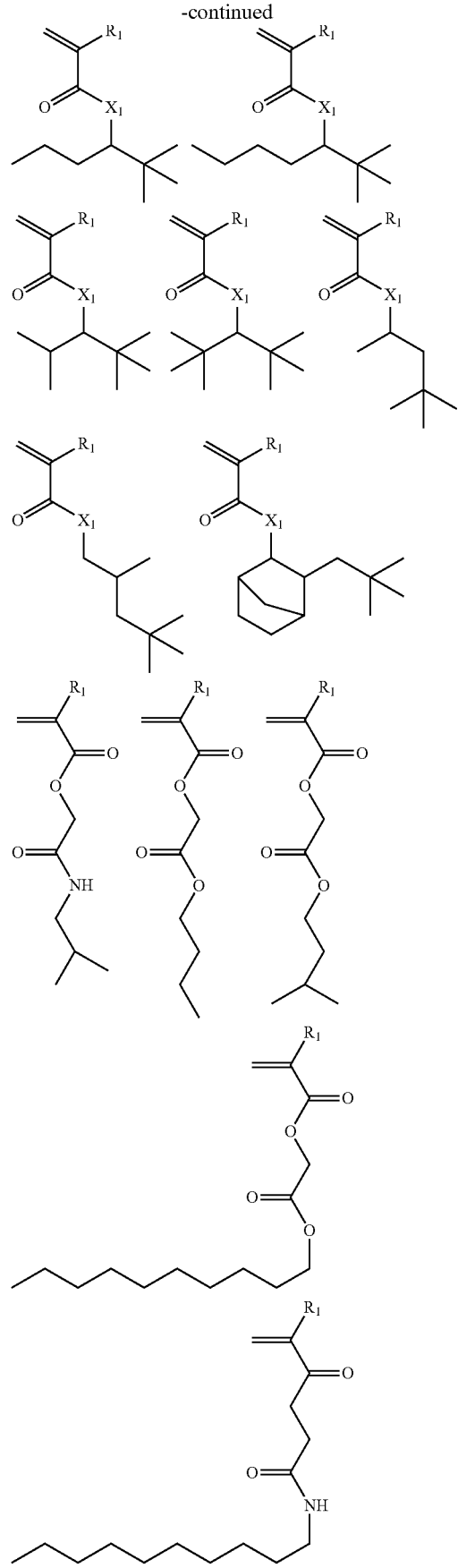
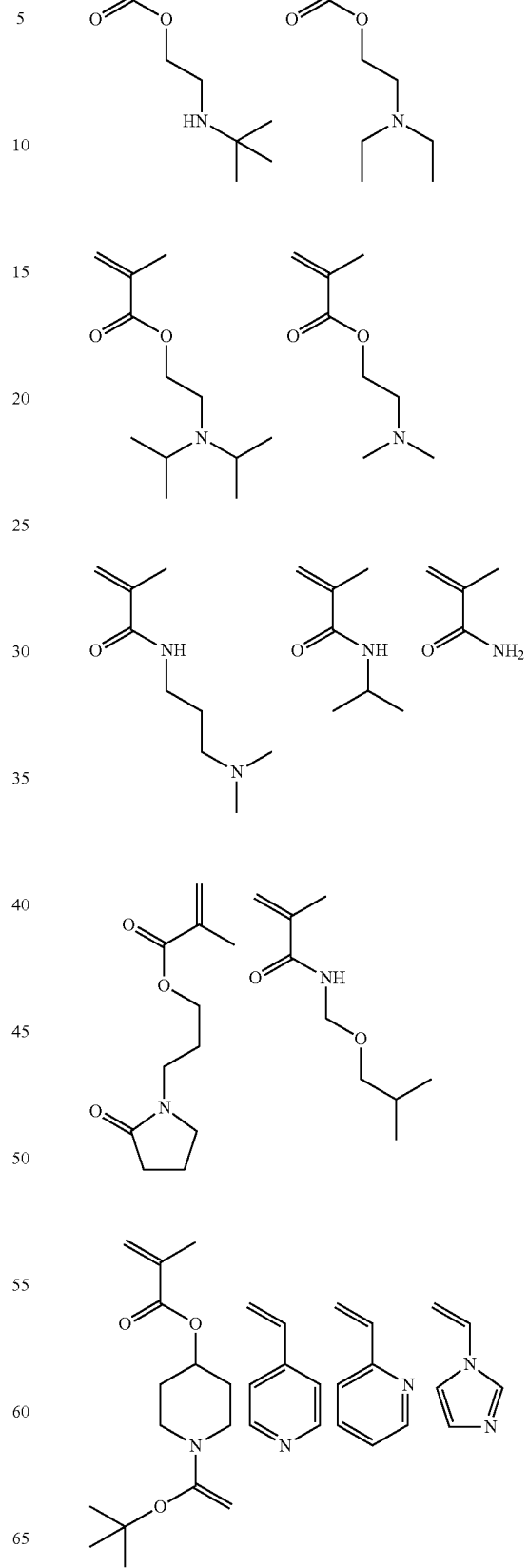

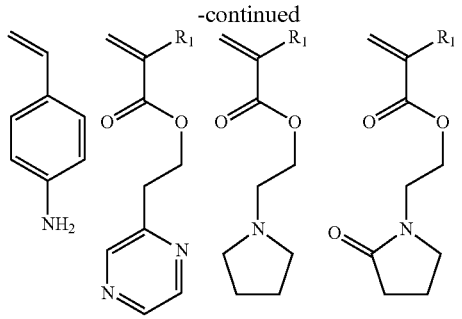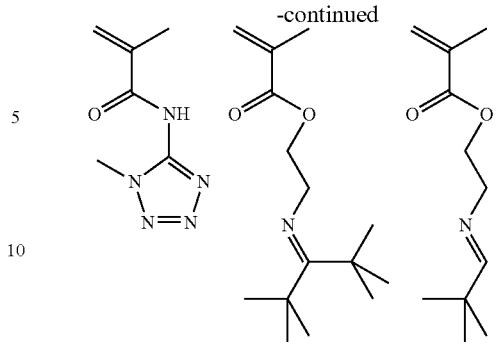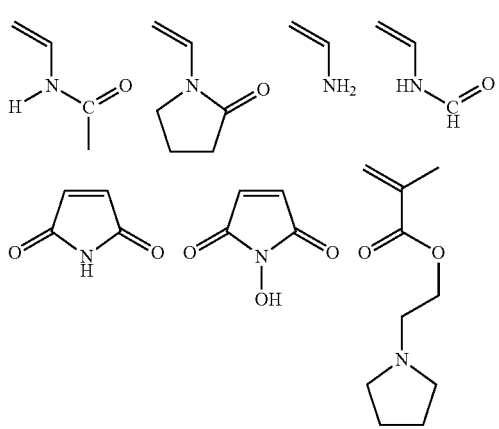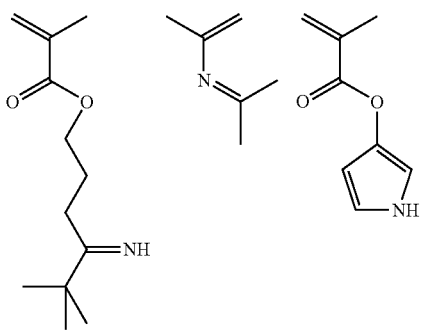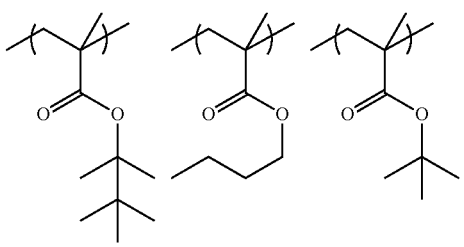
Suitable matrix polymers for the overcoat compositions include, for example, homopolymers and copolymers formed from monomers described above. Exemplary suitable matrix polymers include the following, wherein unit content is provided in mol %:
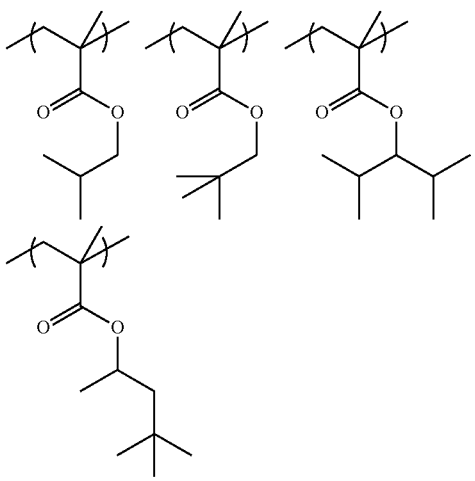

-continued
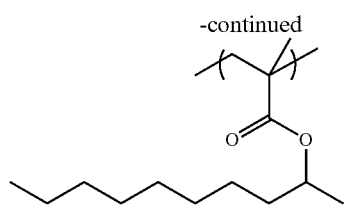
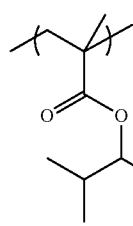 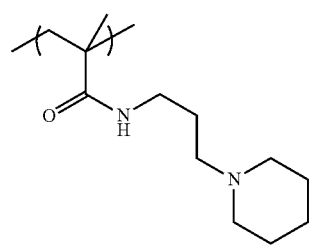
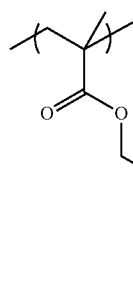 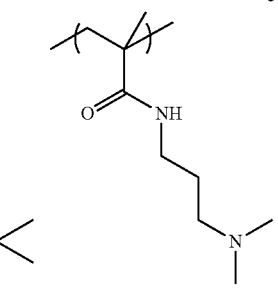
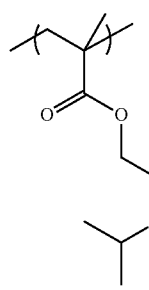 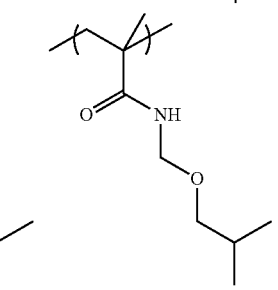
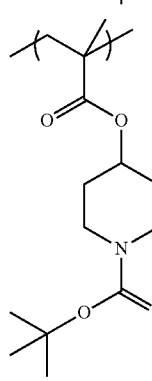 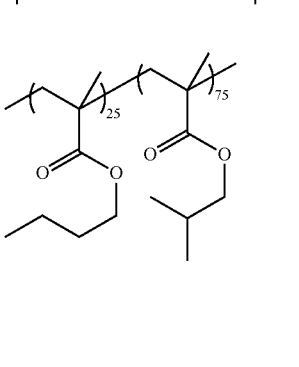
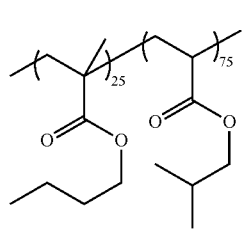 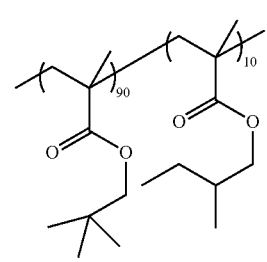
-continued
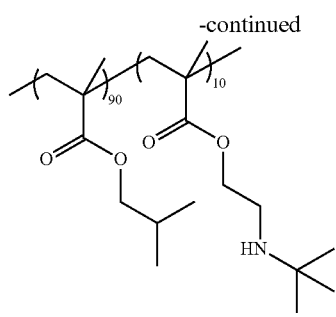
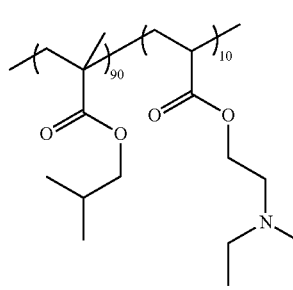
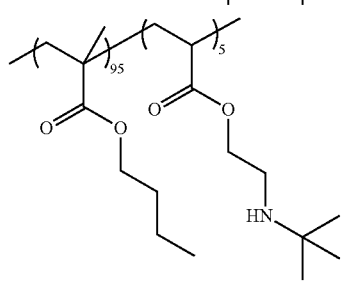
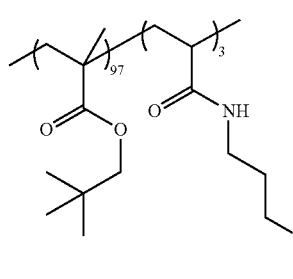
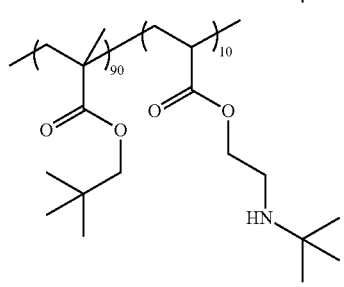
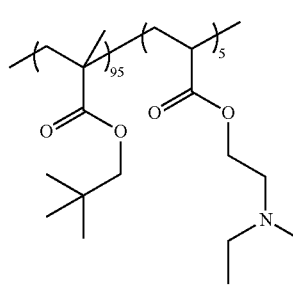

-continued

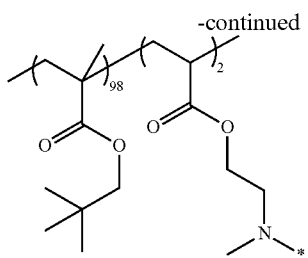

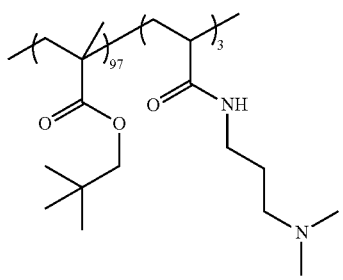

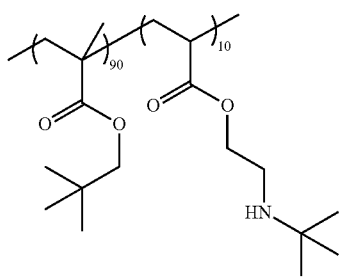

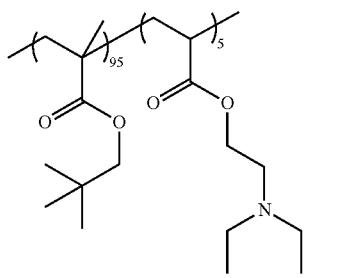

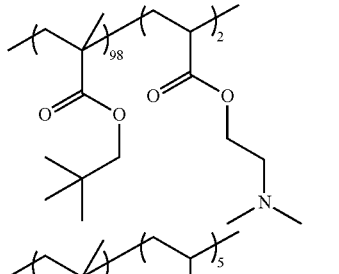

-continued

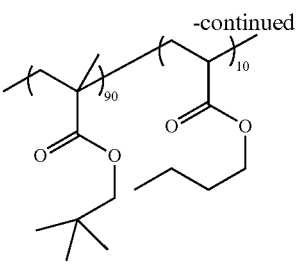

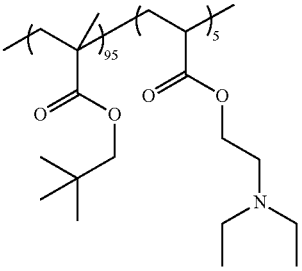

The matrix polymer is typically present in the compositions in an amount of from 70 to 99 wt %, more typically from 85 to 95 wt %, based on total solids of the overcoat composition. The weight average molecular weight of the matrix polymer is typically less than 400,000, preferably from 5000 to 50,000, more preferably from 5000 to 25,000.

Like the matrix polymer, the additive polymer should have very good developability before and after photolithographic treatment, typically exhibits a developer dissolution rate of 100 Å/second or higher, preferably 1000 Å/second or higher, is soluble in the organic solvent of the overcoat composition, described herein, and is soluble in the organic developer used in the negative tone development process. The additive polymer has a lower surface energy than the matrix polymer. Preferably, the additive polymer has a significantly lower surface energy than and is substantially immiscible with the matrix polymer, as well as other polymers present in the overcoat composition. In this way, the overcoat composition can be self-segregating, wherein the additive polymer migrates to the upper surface of the overcoat layer apart from other polymers during coating. The resulting overcoat layer is thereby rich in the additive polymer at the overcoat layer upper surface at the overcoat// immersion fluid interface in the case of an immersion lithography process. The additive polymer surface energy is typically from 15 to 35 mN/m, preferably from 18 to 30 mN/m. The additive polymer is typically from 5 to 25 mN/m less than that of the matrix polymer, preferably from 5 to 15 mN/m less than that of the matrix polymer.

Additive polymers useful in the overcoat compositions can be homopolymers or can be copolymers having a plurality of distinct repeat units, for example, two, three, four or more distinct repeat units. The additive polymer can include units having polymerizable groups chosen, for example, from one or more of (alkyl)acrylate, (alkyl)acrylamide, allyl, maleimide styrene, vinyl, polycyclic (e.g., norbornene) or other group, with (alkyl)acrylate such as (meth)acrylate being preferred. The additive polymer can be a random polymer, a block polymer, or a gradient polymer having a graded change in composition from one monomer unit-type to another monomer unit-type along the length of the polymer chain.

Suitable additive polymers can include, for example, the units and polymers described above with respect to the matrix polymer, with the understanding that the surface energy of the additive polymer is less than that of the matrix polymer to allow for self-segregation of the additive polymer from the matrix polymer during the coating process to allow for the formation of a surface layer rich in the additive polymer. The additive polymer preferably has a branched structure and/or includes one or more fluorinated and/or silicon-containing groups, as their inclusion can result in a polymer having reduced surface energy. It is particularly preferred that the additive polymer includes one or more fluorinated and/or silicon-containing groups, and that the matrix polymer is free of fluorinated and silicon-containing groups.

The additive polymer is formed from a monomer having the following general formula (II) or (III):

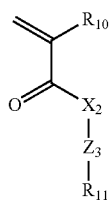

(II)

wherein: $R_{10}$ is chosen from hydrogen and optionally substituted C1 to C3 alkyl, preferably hydrogen or methyl; $R_{11}$ is chosen from optionally substituted C1 to C15 alkyl, preferably C4 to C8 alkyl or fluoroalkyl, more preferably C4 to C6 alkyl or fluoroalkyl and may advantageously include a fluoroalcohol group such as a hexafluoroalcohol group, or a partially fluorinated or perfluorinated cycloalkyl structure; $X_2$ is oxygen, sulfur or is represented by the formula $NR_{12}$, wherein $R_{12}$ is chosen from hydrogen and optionally substituted C1 to C10 alkyl, preferably C1 to C5 alkyl; and $Z_3$ is a single bond or a spacer unit chosen from optionally substituted aliphatic (such as C1 to C6 alkylene) and aromatic hydrocarbons, and combinations thereof, optionally with one or more linking moiety chosen from —O—, —S—, —NHSO$_2$—, —COO— and —CONR$_{13}$— wherein $R_{13}$ is chosen from hydrogen and optionally substituted C1 to C10 alkyl, preferably C2 to C6, alkyl. The monomer of general formula (I) preferably contains fluorine for purposes of reducing surface energy.

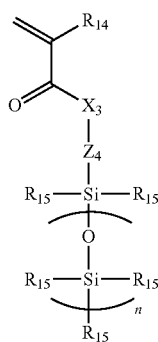

(III)

wherein: $R_{14}$ is chosen from hydrogen and optionally substituted C1 to C3 alkyl, preferably hydrogen or methyl; $R_{15}$ is independently chosen from optionally substituted C1 to C15 alkyl, preferably C4 to C8 alkyl, more preferably C4 to C6 alkyl, and may advantageously include fluorine atoms or a fluoroalcohol group such as a hexafluoroalcohol group, or a partially fluorinated or perfluorinated cycloalkyl structure; $X_3$ is oxygen, sulfur or is represented by the formula $NR_{16}$, wherein $R_{16}$ is chosen from hydrogen and optionally substituted C1 to C10 alkyl, preferably C1 to C5 alkyl; $Z_4$ is a single bond or a spacer unit chosen from optionally substituted aliphatic (such as C1 to C6 alkylene) and aromatic hydrocarbons, and combinations thereof, optionally with one or more linking moiety chosen from —O—, —S—, —COO— and —CONR$_{17}$— wherein $R_{17}$ is chosen from hydrogen and optionally substituted C1 to C10 alkyl, preferably C2 to C6, alkyl; and n is an integer from 0 to 2.

Units of general formula (II) or (III) are typically present in the additive polymer in an amount of from 50 to 100 mol %, for example, from 70 to 100 mol %, from 80 to 100 mol %, from 90 to 100 mol % or 100 mol %, based on the additive polymer. Exemplary suitable monomers for use in forming the additive polymer are described below, but are not limited to these structures ("$R_{10}$", "$R_{14}$" and "$X_2$" and "$X_3$" are as defined above):

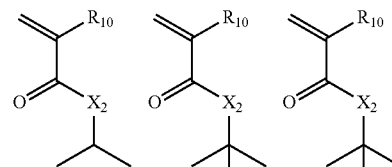

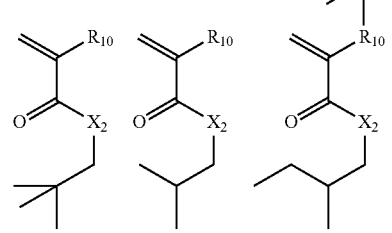

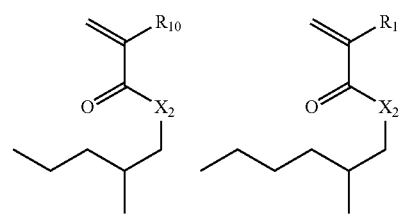

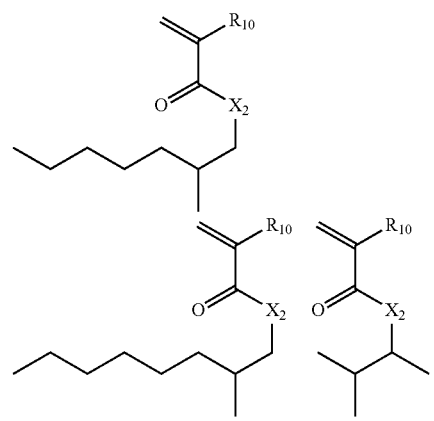

-continued
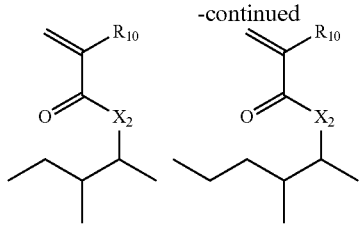
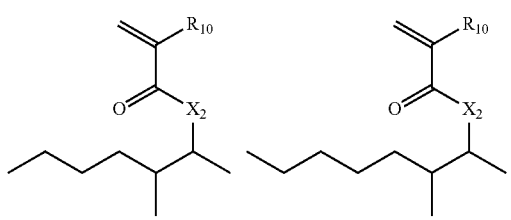
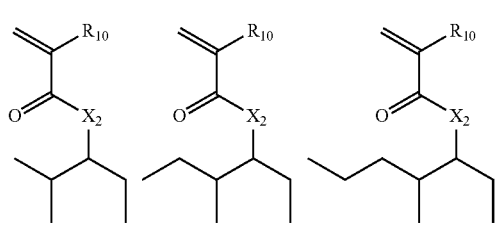
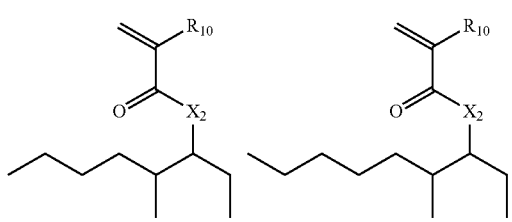
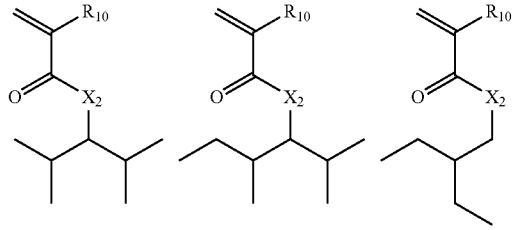
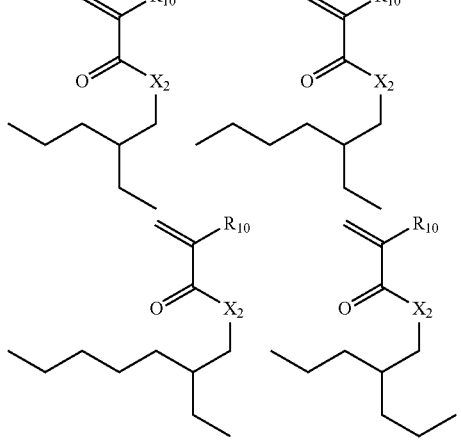
-continued
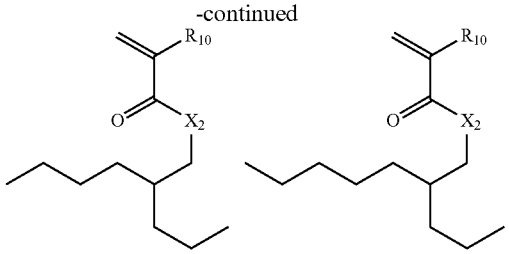
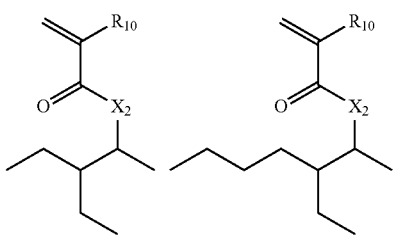
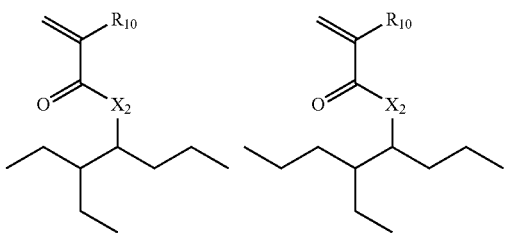
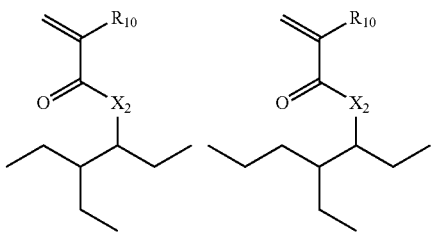
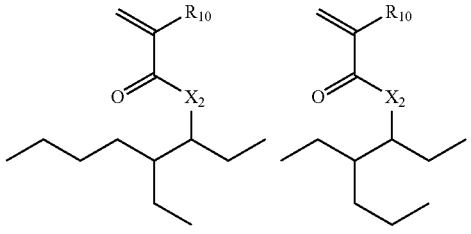
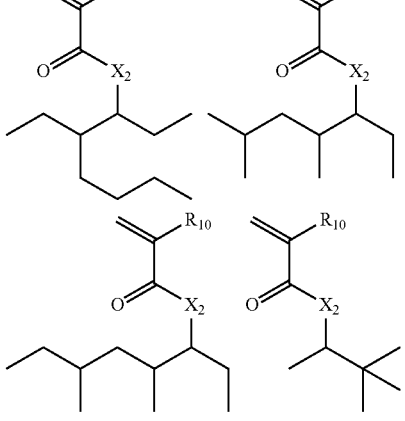

-continued
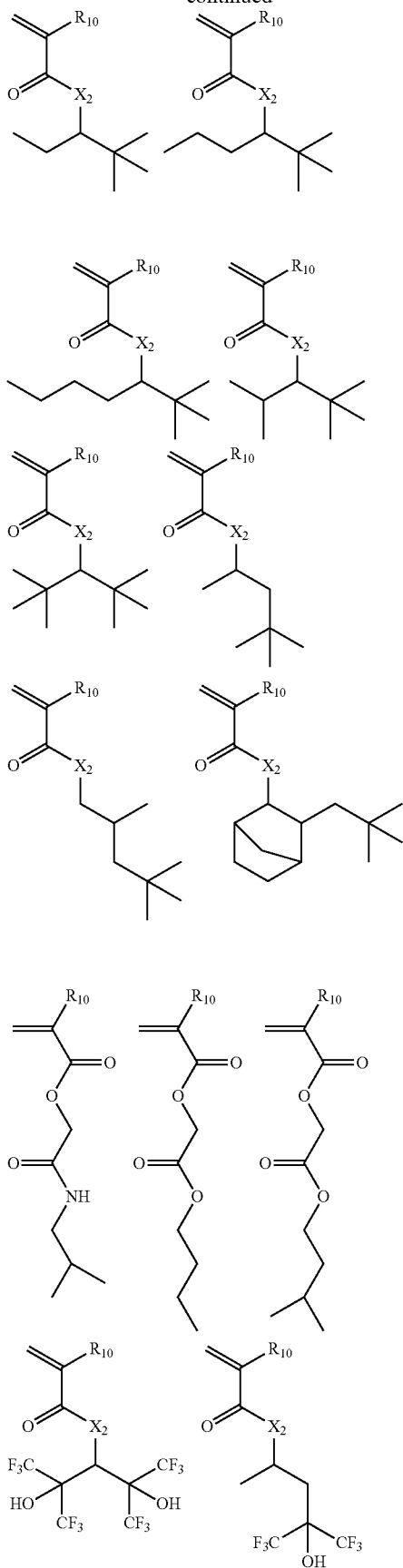
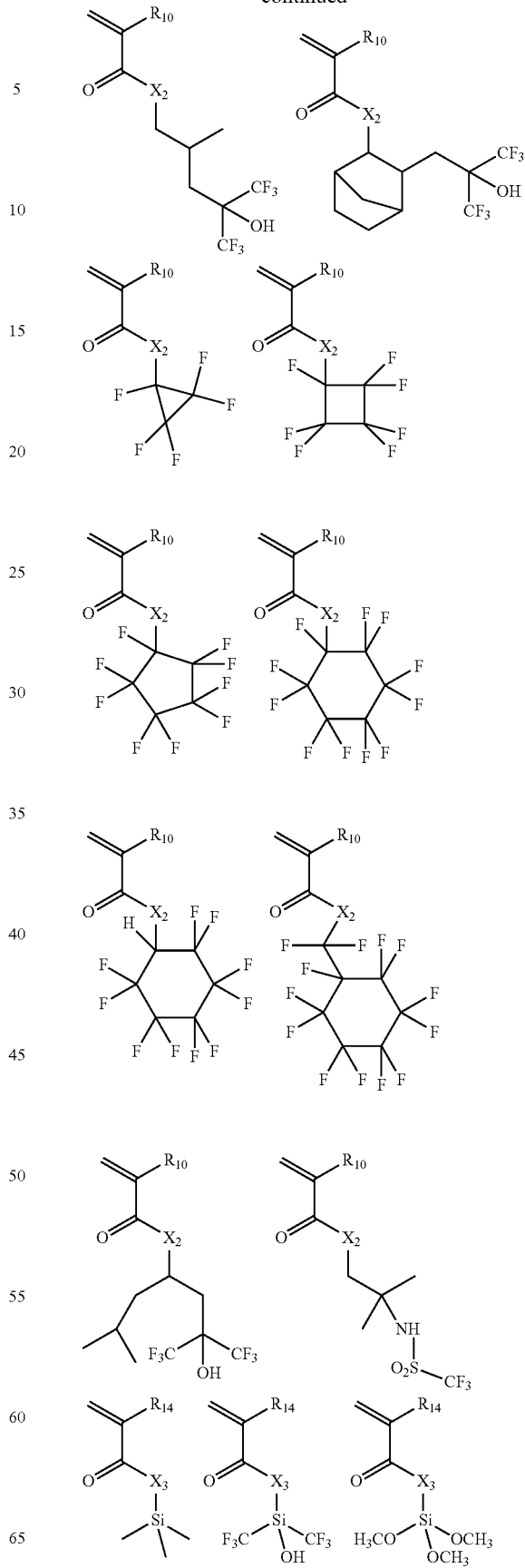

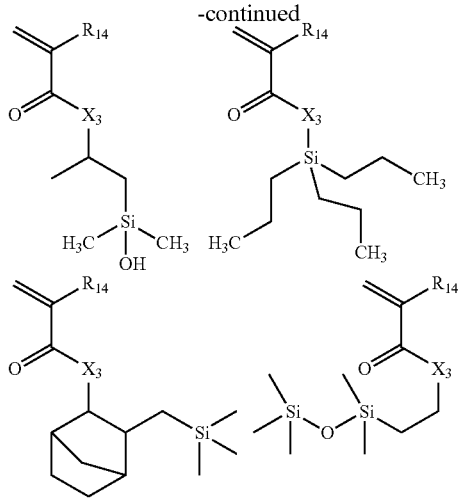
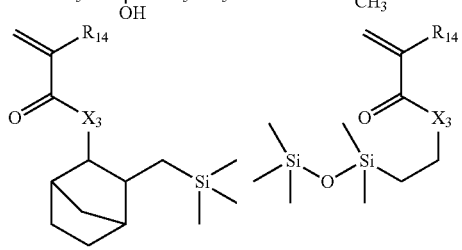
Suitable additive polymers for the overcoat compositions include homopolymers and copolymers formed from monomers described above, with the following polymers being preferred, wherein unit content is provided in mol %:
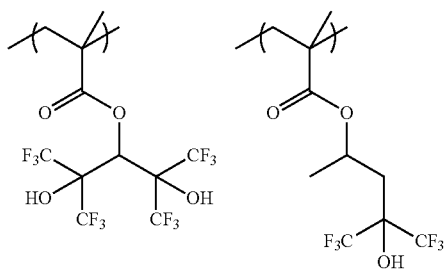
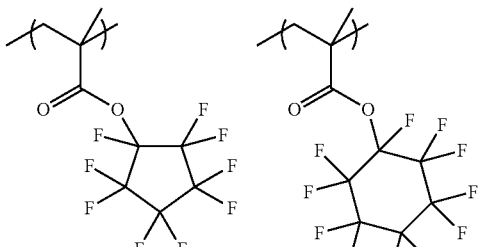
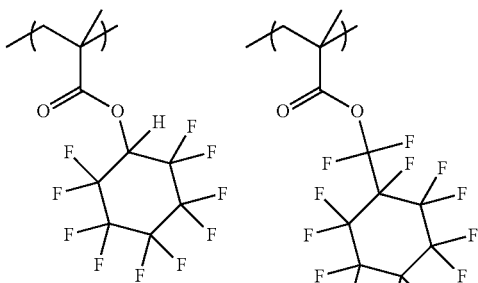
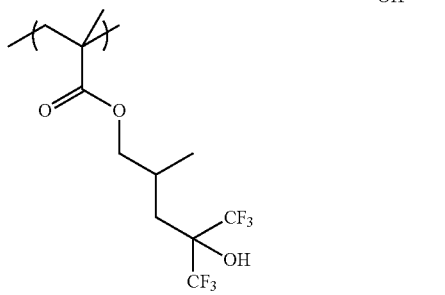
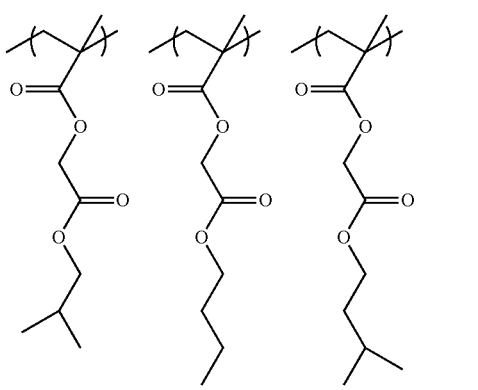
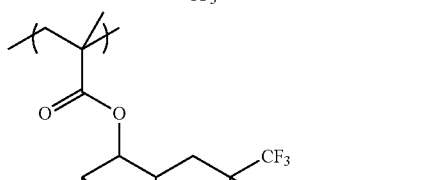
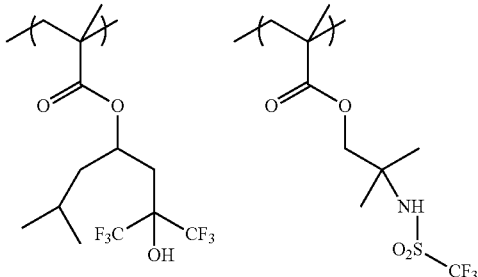
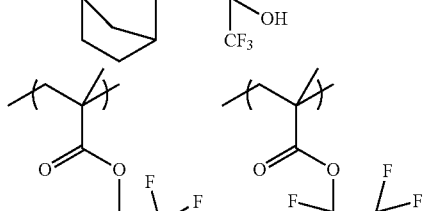
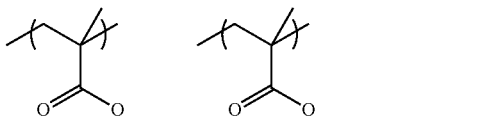
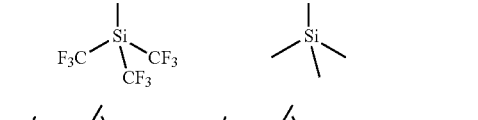
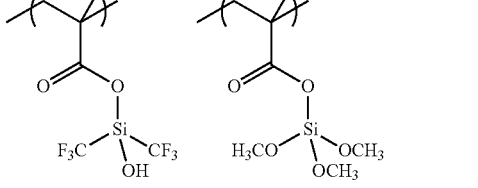

-continued

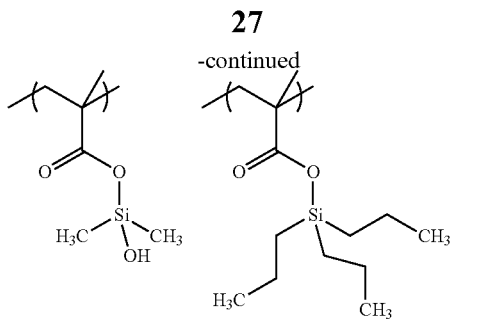
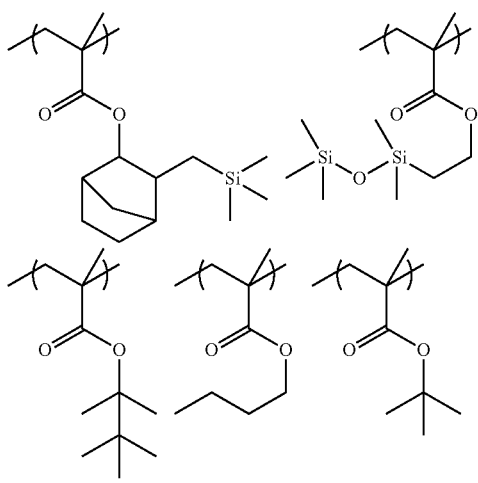
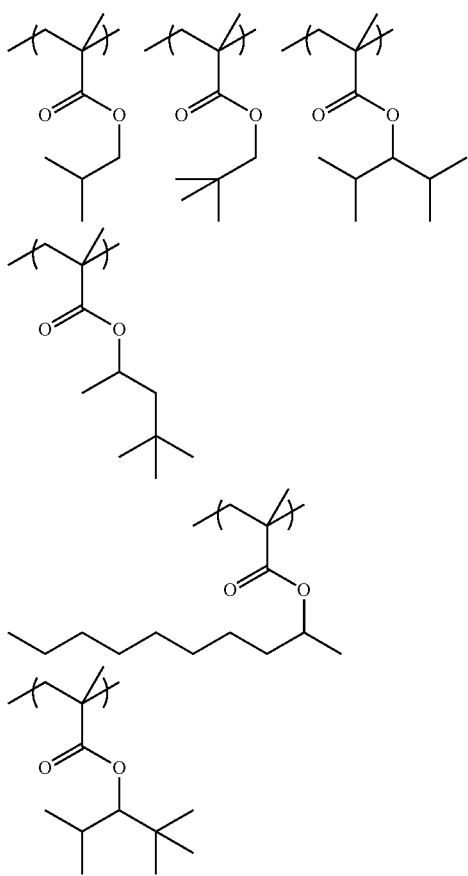

-continued

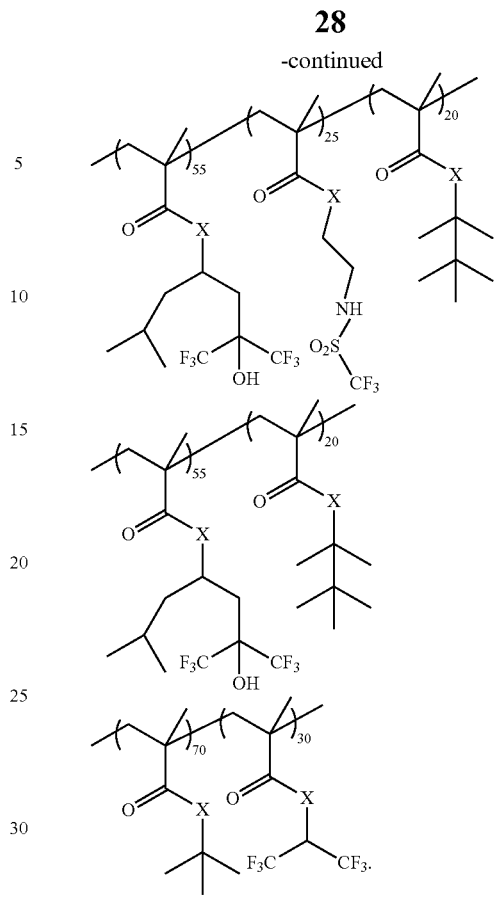

The content of the additive polymer may depend, for example, on whether the lithography is a dry or immersion-type process. For example, the additive polymer lower limit for immersion lithography is generally dictated by the need to prevent leaching of the photoresist components. The additive polymer is typically present in the compositions in an amount of from 1 to 30 wt %, more typically from 3 to 20 wt % or 5 to 15 wt %, based on total solids of the overcoat composition. The weight average molecular weight of the additive polymer is typically less than 400,000, preferably from 5000 to 50,000, more preferably from 5000 to 25,000.

The photoresist overcoat compositions further include a basic quencher. The basic quencher is present for purposes of neutralizing acid generated in the surface region of the underlying photoresist layer by stray light which reaches what are intended to be unexposed (dark) regions of the photoresist layer. This allows for improvement in depth of focus in the defocus area and exposure latitude by controlling unwanted deprotection reaction in the unexposed areas. As a result, irregularities in the profile, for example, necking and T-topping, in formed resist patterns can be minimized or avoided.

As discussed above, the basic quencher can be present in the matrix polymer or can be of an additive type. To allow for effective interaction between the basic quencher and the acid generated in the dark areas of the underlying photoresist layer, the basic quencher should be of a non-surfactant-type. That is, the basic quencher should not be of a type that migrates to the top surface of the overcoat layer due, for example, to a low surface free energy relative to other components of the overcoat composition. In such a case, the basic quencher would not be appreciably present at the photoresist layer interface for interaction with the generated acid to prevent acid deprotection. The basic quencher should therefore be of a type that is present at the overcoat layer/photoresist layer interface, whether being uniformly dispersed through the overcoat layer or forming a graded or segregated layer at the interface. Such a layer can be achieved by selection of a basic quencher having a high surface free energy relative to other components of the overcoat composition.

Suitable basic quenchers include, for example: linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. Of these basic quenchers, 1-(tert-butoxycarbonyl)-4-hydroxypiperidine and triisopropanolamine are preferred. While the content of the basic quencher will depend, for example, on the content of the photoacid generator in the underlying photoresist layer, it is typically present in an amount of from 0.1 to 5 wt %, preferably from 0.5 to 3 wt %, more preferably from 1 to 3 wt %, based on total solids of the overcoat composition.

The overcoat compositions further include an organic solvent or mixture of organic solvents. Suitable solvent materials to formulate and cast the overcoat composition exhibit excellent solubility characteristics with respect to the non-solvent components of the overcoat composition, but do not appreciably dissolve an underlying photoresist layer. Suitable organic solvents for the overcoat composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the overcoat composition is typically present in an amount of from 90 to 99 wt % based on the overcoat composition.

The photoresist overcoat compositions can include one or more optional materials. For example, the compositions can include one or more of actinic and contrast dyes, anti-striation agents, and the like. Of these, actinic and contrast dyes are preferred for enhancing antireflective properties of layers formed from the compositions. Such optional additives if used are typically present in the composition in minor amounts such as from 0.1 to 10 wt % based on total solids of the overcoat composition. The overcoat compositions are preferably free of acid generator compounds, for example, thermal acid generator compounds and photoacid generator compounds, as such compounds may neutralize the effect of the basic quencher in the overcoat compositions.

The photoresist overcoat compositions can be prepared following known procedures. For example, the compositions can be prepared by dissolving solid components of the composition in the solvent components. The desired total solids content of the compositions will depend on factors such as the particular polymer(s) in the composition and desired final layer thickness. Preferably, the solids content of the overcoat compositions is from 1 to 10 wt %, more preferably from 1 to 5 wt %, based on the total weight of the composition.

Resist overcoat layers formed from the compositions typically have an index of refraction of 1.4 or greater at 193 nm, preferably 1.47 or greater at 193 nm. The index of refraction can be tuned by changing the composition of the matrix polymer, the additive polymer or other components of the overcoat composition. For example, increasing the relative amount of organic content in the overcoat composition may provide increased refractive index of the layer. Preferred overcoat composition layers will have a refractive index between that of the immersion fluid and the photoresist at the target exposure wavelength.

Reflectivity of the overcoat layer can be reduced if the refractive index of the overcoat layer ($n_1$) is the geometric mean of that of the materials on either side ($n_1 = \sqrt{(n_0 n_2)}$), where $n_0$ is the refractive index of water in the case of immersion lithography or air for dry lithography, and $n_2$ is the refractive index of the photoresist. Also to enhance antireflective properties of layers formed from the overcoat compositions, it is preferred that the thickness of the overcoat ($d_1$) is chosen such that the wavelength in the overcoat is one quarter the wavelength of the incoming wave ($\lambda_0$). For a quarter wavelength antireflective coating of an overcoat composition with a refractive index $n_1$, the thickness $d_1$ that gives minimum reflection is calculated by $d_1 = \lambda_0/(4 n_1)$.

NTD Photoresist Compositions

Photoresist compositions useful in the invention include chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following softbake, exposure to activating radiation and post exposure bake. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group. Suitable photoresist compositions useful for the invention are commercially available.

For imaging at sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene.

Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable heteroatom group containing matrix polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions. Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight Mw of the matrix polymer is typically less than 100,000, for example, from 5000 to 100,000, more typically from 5000 to 15,000.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris (trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, negative-acting resist compositions typically also include a crosslinker component. Suitable crosslinker components include, for example, an amine-based material such as a melamine resin, that will cure, crosslink or harden upon exposure to acid on exposure of a photoacid generator to activating radiation. Preferred crosslinkers include amine-based materials, including melamine, glycolurils, benzoguanamine-based materials and urea-based materials. Melamine-formaldehyde resins are generally most preferred. Such crosslinkers are commercially available, e.g., the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125. For imaging at sub-200 nm wavelengths such as 193 nm, preferred negative-acting photoresists are disclosed in WO 03077029 to the Shipley Company.

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis (2-hydroxyethyl)pivalamide, N,N-Diethylacetamide, N1,N1,N3,N3-tetrabutylmalonamide, 1-methylazepan-2- one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis (azanetriyl))tetraethanol, and 2-(dibutylamino)ethanol, 2,2', 2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Suitable NTD photoresists are known in the art and include, for example, those described in US Patent Publications US20130115559A1, US20110294069A1, US20120064456A1, US20120288794A1, US20120171617A1, US20120219902A1 and U.S. Pat. No. 7,998,655B2.

Negative Tone Development Methods

Processes of using the compositions in accordance with the invention will now be described with reference to FIG. 1A-C, which illustrates an exemplary process flow for forming a photolithographic pattern by negative tone development.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and critical dimension (CD) control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist layer 104 formed from a composition such as described herein is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 104 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

A photoresist overcoat layer 106 formed from an overcoat composition as described herein is formed over the photoresist layer 104. The overcoat composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning To reduce reflectivity of the overcoat layer, the thickness is preferably chosen such that the wavelength in the overcoat is one quarter the wavelength of the incoming wave. A typical thickness for the photoresist overcoat layer 106 is from 200 to 1000 Å. The basic quencher may be present in the overcoat layer 106 dispersed homogeneously through the overcoat layer, or may be present as a segregated or graded quencher region 107 disposed at the overcoat layer-photoresist layer interface.

The photoresist overcoat layer can next be baked to minimize the solvent content in the layer. The bake can be conducted on a hotplate or in an oven, with a hotplate being typical. Typical bakes are conducted at a temperature of from about 80 to 120° C., and a time of from about 30 to 90 seconds.

The photoresist layer 104 is next exposed to activating radiation 108 through a first photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 112, 114 corresponding to regions of the resist layer to remain and be removed, respectively, in a subsequent development step. The exposure wavelength is typically sub-400 nm, sub-300 nm or sub-200 nm, with 248 nm and 193 nm being typical. The methods find use in immersion or dry (non-immersion) lithography techniques. The exposure energy is typically from about 10 to 80 mJ/cm$^2$, dependent upon the exposure tool and the components of the photosensitive composition.

Following exposure of the photoresist layer 104, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. Following post exposure bake, it is believed that the basic quencher diffuses into the surface region of the photoresist layer 104 as shown by dashed lines 109. A latent image 116 defined by the boundary (dashed line) between polarity-switched and unswitched regions (corresponding to exposed and unexposed regions, respectively) is formed in the photoresist as shown in FIG. 1B. The diffused basic quencher in the photoresist is believed to prevent polarity switch in undesired dark regions of the photoresist layer, resulting in a latent image with vertical walls.

The overcoat layer 106 and exposed photoresist layer are next developed to remove unexposed regions of the photoresist layer 104, leaving exposed regions forming an open resist pattern 104' with contact hole pattern 120 having vertical sidewalls as shown in FIG. 1C. The developer is typically an organic developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

Mixtures of organic solvents can be employed as a developer, for example, a mixture of a first and second organic solvent. The first organic solvent can be chosen from hydroxy alkyl esters such as methyl-2-hydroxyisobutyrate and ethyl lactate; and linear or branched $C_5$ to $C_6$ alkoxy alkyl acetates such as propylene glycol monomethyl ether acetate (PGMEA). Of the first organic solvents, 2-heptanone and 5-methyl-2-hexanone are preferred. The second organic solvent can be chosen from linear or branched unsubstituted $C_6$ to $C_8$ alkyl esters such as n-butyl acetate, n-pentyl acetate, n-butyl propionate, n-hexyl acetate, n-butyl butyrate and isobutyl butyrate; and linear or branched $C_8$ to $C_9$ ketones such as 4-octanone, 2,5-dimethyl-4-hexanone and 2,6-dimethyl-4-heptanone. Of the second organic solvents, n-butyl acetate, n-butyl propionate and 2,6-dimethyl-4-heptanone are preferred. Preferred combinations of the first and second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone and 2-heptanone/n-butyl acetate. Of these, 2-heptanone/n-butyl acetate and 2-heptanone/n-butyl propionate are particularly preferred.

The organic solvents are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature. The development process can be conducted without use of a cleaning rinse following development. In this regard, it has been found that the development process can result in a residue-free wafer surface rendering such extra rinse step unnecessary.

The BARC layer, if present, is selectively etched using resist pattern 104' as an etch mask, exposing the underlying hardmask layer. The hardmask layer is next selectively etched, again using the resist pattern 104' as an etch mask, resulting in patterned BARC and hardmask layers. Suitable etching techniques and chemistries for etching the BARC layer and hardmask layer are known in the art and will depend, for example, on the particular materials of these layers. Dry-etching processes such as reactive ion etching are typical. The resist pattern 104' and patterned BARC layer are next removed from the substrate using known techniques, for example, oxygen plasma ashing.

Using the hardmask pattern as an etch mask, the one or more layers 102 are selectively etched. Suitable etching techniques and chemistries for etching the underlying layers 102 are known in the art, with dry-etching processes such as reactive ion etching being typical. The patterned hardmask layer can next be removed from the substrate surface using known techniques, for example, a dry-etching process such as reactive ion etching. The resulting structure is a pattern of etched features. In an alternative exemplary method, it may be desirable to pattern the layers 102 directly using the resist pattern 104' without the use of a hardmask layer. Whether direct patterning is employed will depend on factors such as the materials involved, resist selectivity, resist pattern thickness and pattern dimensions.

The negative tone development methods are not limited to the exemplary methods described above. For example, the photoresist overcoat compositions can be used in a negative tone development double exposure method for making contact holes. An exemplary such process is a variation of the technique described with reference to FIG. 1, but using an additional exposure of the photoresist layer in a different pattern than the first exposure. In this process, the photoresist layer is exposed to actinic radiation through a photomask in a first exposure step. The photomask includes a series of parallel lines forming the opaque regions of the mask. Following the first exposure, a second exposure of the photoresist layer is conducted through a second photomask that includes a series of lines in a direction perpendicular to those of the first photomask. The resulting photoresist layer includes unexposed regions, once-exposed regions and twice-exposed regions. Following the second exposure, the photoresist layer is post-exposure baked and developed using a developer as described above. Unexposed regions corresponding to points of intersection of the lines of the two masks are removed, leaving behind the once- and twice-exposed regions of the resist. The resulting structure can next be patterned as described above with reference to FIG. 1.

Further refined resolution for features such as contact holes and trench patterns can be achieved using an NTD overexposure process. In this process, the photomask has large patterns relative to those to be printed on the wafer. Exposure conditions are selected such that light diffuses beneath the edge of the photomask pattern causing the polarity switch in the resist to extend beneath these edge regions.

The following non-limiting examples are provided to further describe patterning methods and overcoat compositions in accordance with the invention.

Examples

Photoresist Polymers (PP) Synthesis

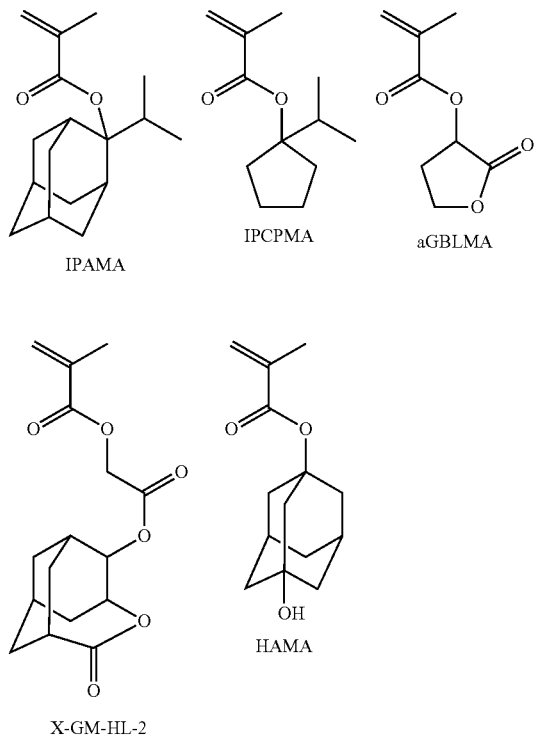

Poly(IPAMA/IPCPMA/aGBLMA/X-GM-HL-2/HAMA) (PP-1)

Monomers of IPAMA (20.68 g), IPCPMA (24.72 g), aGBLMA (27.78 g), X-GM-HL-2 (17.26 g) and HAMA (11.46 g) were dissolved in 108.33 g of ethyl lactate/γ-butyrolactone (gBL) (7/3). The monomer solution was degassed by bubbling with nitrogen for 20 min. Ethyl lactate/γ-butyrolactone (gBL) (113 g) was charged into a 500 mL Jacket reactor equipped with a condenser and a mechanical stirrer and was degassed by bubbling with nitrogen for 20 min. Subsequently, the solvent in the reaction flask was brought to a temperature of 80° C. V-601 (dimethyl-2,2-azodiisobutyrate) (3.974 g) was dissolved in 12 g of ethyl lactate/gBL and the initiator solution was degassed by bubbling with nitrogen for 20 min. The initiator solution was added into the reactor and then monomer solution was fed into the reactor dropwise over a 3.5 hour period under rigorous stirring and nitrogen environment. After monomer feeding was complete, the polymerization mixture was left standing for an additional 0.5 hour at 80° C. After reaction was completed, the polymerization mixture was allowed to cool down to room temperature. Precipitation was carried out in MeOH (3000 g). The powder precipitated was collected by filtration, air-dried overnight, re-dissolved in 120 g of THF, and re-precipitated into MeOH (3000 g). The final polymer was filtered, air-dried overnight and further dried under vacuum at 60° C. for 48 hours to give Polymer PP-1 (Mw=7785; PDI=1.36; yield=82.75%)

PP-1

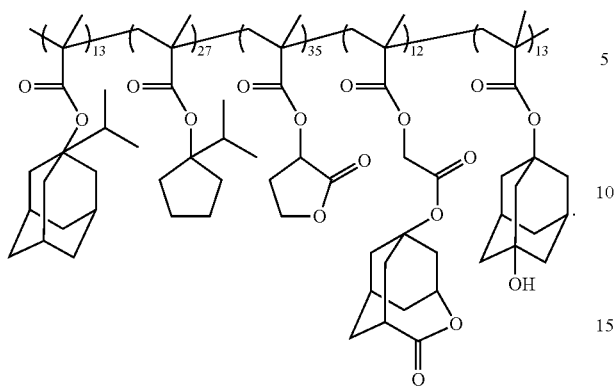

Overcoat Matrix Polymer (MP) Synthesis

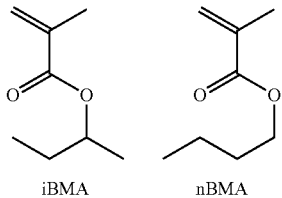

iBMA        nBMA

Poly(iBMA/nBMA) (75/25) (MP-1)

30 g of isobutyl methacrylate (iBMA) and 10 g of n-butyl methacrylate (nBMA) monomers were dissolved in 60 g of PGMEA. The monomer solution was degassed by bubbling with nitrogen for 20 min. PGMEA (32.890 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (3.239 g) was dissolved in 8 g of PGMEA and the initiator solution was degassed by bubbling with nitrogen for 20 min. The initiator solution was added into the reaction flask and then monomer solution was fed into the reactor dropwise over a 3 hour period under rigorous stiffing and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1730 g). The precipitated polymer was collected by filtration, air-dried overnight, re-dissolved in 120 g of THF, and re-precipitated into methanol/water (8/2) mixture (1730 g). The final polymer was filtered, air-dried overnight and further dried under vacuum at 25° C. for 48 hours to give 33.1 g of poly(iBMA/nBMA) (75/25) copolymer (MP-1) (Mw=9,203; Mw/Mn=1.60; Yield=82.75%). The results of the synthesis are described in Table 1.

MP-1

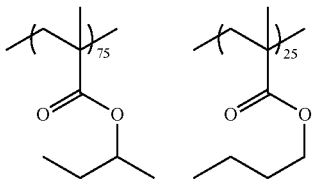

Overcoat Additive Polymer (AP) Synthesis

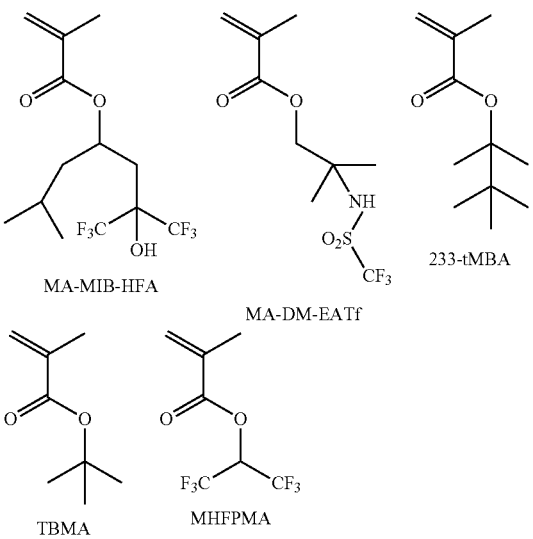

MA-MIB-HFA        MA-DM-EATf        233-tMBA

TBMA        MHFPMA

Poly(MA-MIB-HFA/MA-DM-EATf/233-tMBA) (55/25/20) (AP-1)

25 g of PGMEA was charged to a 200 ml reactor and heated to 99° C. under nitrogen purge for 30 mins 27.5 g of MA-MIB-HFA monomer, 12.5 g of MA-DM-EATf monomer and 10 g of 233-tMBA monomer were dissolved in 7.02 g of PGMEA solvent, and the monomer solution was degassed by bubbling with nitrogen. 1.80 g of V601 (dimethyl-2,2-azodiisobutyrate) was dissolved in 16.18 g of PGMEA and the monomer solution was degassed by bubbling with nitrogen. The initiator solution was fed into the reactor dropwise over 120 min with a feeding rate of 0.150 g/min. The monomer solution was also fed into the reactor dropwise over 120 min with a feeding rate 0.475 g/min under rigorous stirring and nitrogen environment. After feeding was complete, the polymerization mixture was left standing for an additional 2 hours. The polymerization mixture was then allowed to cool down to room temperature, resulting in a solution of Poly(MA-MIB-HFA/MA-DM-EATf/tMBA) (55/25/20) copolymer (AP-1) (Mw=9017; Mw/Mn=1.87; Yield=35.7%). The results of the synthesis are described in Table 1.

AP-1

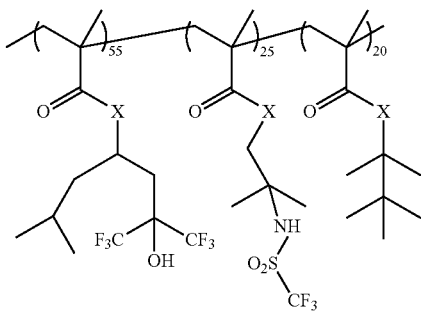

Poly(MA-MIB-HFA/233-tMBA) (80/20) (AP-2)

25 g of PGMEA was charged to 200 ml reactor and heated to 99° C. under nitrogen purge for 30 min. 40 g of MA-MIB-HFA monomer and 10 g of 233-tMBA monomer were mixed and dissolved in 10 g of PGMEA solvent. 1.50 g of V601 (dimethyl-2,2-azodiisobutyrate) was dissolved in 13.5 g of PGMEA. The monomer and initiator solution were degassed by bubbling with nitrogen. The initiator solution was fed into the reactor dropwise over 110 min. with a feeding rate of 0.136 g/min. The monomer solution was also fed into the reactor dropwise over 110 min. at a feeding rate of 0.545 g/min under rigorous stirring and nitrogen environment. After feeding was complete, the polymerization mixture was left standing for an additional 2 hours. The polymerization mixture was then allowed to cool down to room temperature, resulting in a solution of Poly(MA-MIB-HFA/233-tMBA) (80/20) copolymer (AP-2) (Mw=8945; Mw/Mn=1.91; Yield=42.1%). The results of the synthesis are described in Table 1.

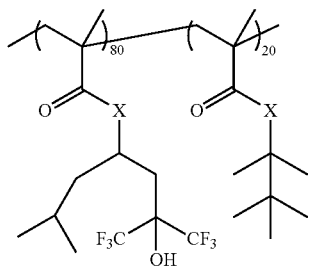

AP-2

Poly(MA-MIB-HFA) (AP-3)

300 g of isobutyl isobutyrate (IBIB) was charged to a 2 L reactor and heated to 99° C. under nitrogen purge. 400 g of MA-MIB-HFA monomer and 14.4 g V601 (dimethyl-2,2-azodiisobutyrate) were dissolved in 285.7 g of IBIB and the monomer solution was degassed by bubbling with nitrogen and was subsequently fed into the reactor dropwise over a 120 min. period under rigorous stirring and nitrogen environment. After monomer feeding was complete, the polymerization mixture was left standing for an additional 5 hours at 99° C. The polymerization mixture was then allowed to cool down to room temperature, resulting in a solution of Poly(MA-MIB-HFA) homopolymer (AP-3) (Mw=6768; Mw/Mn=1.658; Yield=29.83%). The results of the synthesis are described in Table 1.

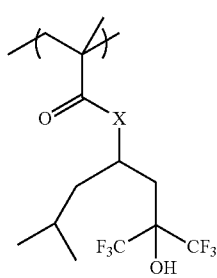

AP-3

Poly(TBMA/MHFPMA) (70/30) (AP-4)

53.94 g of PGMEA was charged to 300 ml reactor and heated to 99° C. under nitrogen purge for 30 min. 57.18 g of TBMA monomer and 50.7 g of MHFPMA monomer were mixed and dissolved in 15.14 g of PGMEA. The monomer solution was degassed by bubbling with nitrogen. 3.88 g of V601 (dimethyl-2,2-azodiisobutyrate) was dissolved in 34.91 g of PGMEA and the initiator solution was fed into the reactor dropwise over 110 min. at a feeding rate of 0.353 g/min. The monomer solution was also fed into the reactor dropwise over 110 min. at a feeding rate of 1.118 g/min under rigorous stirring and nitrogen environment. After feeding was complete, the polymerization mixture was left standing for an additional 2 hours. The polymerization mixture was then allowed to cool down to room temperature, resulting in a solution of Poly(TBMA/MHFPMA) copolymer (AP-4) (Mw=10,944; Mw/Mn=1.74; Yield=45.2%). The results of the synthesis are described in Table 1.

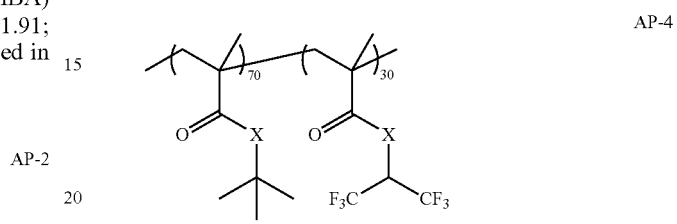

AP-4

TABLE 1

| Polymer | Monomer(s) | Composition* | Yield | Mw | Mw/Mn |
|---|---|---|---|---|---|
| MP-1 | iBMA/nBMA | 75/25 | 82.75% | 9,203 | 1.60 |
| AP-1 | MA-MIB-HFA/ MA-DM-EATf/ tMBA | 55/25/20 | 35.7% | 9,017 | 1.87 |
| AP-2 | MA-MIB-HFA/ tMBA | 80/20 | 42.1% | 8,945 | 1.91 |
| AP-3 | MA-MIB-HFA | 100 | 29.83% | 6,768 | 1.658 |
| AP-4 | TBMA/MHFPMA | 70/30 | 45.2% | 10,944 | 1.74 |

*Molar feed ratio in the polymerization

Preparation of Photoresist Composition (PC-1)

31.219 g of Polymer PP-1 solution (10 wt %) in PGMEA, 5.415 g of Triphenylsulfonium perfluorobutane sulfonate solution (1 wt %) in PGMEA, 15.047 g of Triphenylsulfonium 2-(((3r,5r,7r)-adamantane-1-carbonyl)oxy)-1,1-difluoroethanesulfonate solution (1 wt %) in PGMEA, 3.01 g of 2,2'-(dodecylazanediyl)diethanol solution (1%) in PGMEA, 14.336 g of Triphenylsulfonium ((1S,4S)-7,7-dimethyl-2-oxobicyclo[2.2.1]heptan-1-yl)methanesulfonate (1%) in PGMEA, 21.324 g PGMEA and 9.650 g of γ-butyrolactone were mixed for 4 hours. The mixture was filtered with a 0.2 micron Nylon filter to provide photoresist composition PC-1.

Preparation of Resist Overcoat Compositions (OC)

Resist overcoat compositions were prepared by dissolving an overcoat matrix polymer, additive polymer and basic quencher in a solvent using the components and amounts set forth in Table 2. The resulting mixtures were rolled on a mechanical roller for three hours and then filtered through a Teflon filter having a 0.2 micron pore size. The compositions were formulated based on target thicknesses (after spin coating at ~1500 rpm) of 290 Å, corresponding to ¼ the wavelength of the incoming wave to reduce reflectance at the overcoat surface.

TABLE 2

| Overcoat composition | Matrix Polymer | Additive Polymer | Basic Quencher | Solvent | Target thickness |
|---|---|---|---|---|---|
| OC-1 (Comp) | MP-1 0.3109 g | — | 0.4095 g | IBIB 29.2796 g | 290 Å |

TABLE 2-continued

| Overcoat composition | Matrix Polymer | Additive Polymer | Basic Quencher | Solvent | Target thickness |
|---|---|---|---|---|---|
| OC-2 | MP-1 0.2954 g | AP-1 0.0155 g | 0.4095 g | IBIB 29.2796 g | 290 Å |
| OC-3 | MP-1 0.2954 g | AP-2 0.0155 g | 0.4095 g | IBIB 29.2796 g | 290 Å |
| OC-4 | MP-1 0.2954 g | AP-3 0.0155 g | 0.4095 g | IBIB 29.2796 g | 290 Å |
| OC-5 | MP-1 0.2891 g | AP-3 0.0218 g | 0.4095 g | IBIB 29.2796 g | 290 Å |
| OC-6 | MP-1 0.2798 g | AP-3 0.0311 g | 0.4095 g | IBIB 29.2796 g | 290 Å |
| OC-7 | MP-1 0.2954 g | AP-4 0.0155 g | 0.4095 g | IBIB 29.2796 g | 290 Å |

IBIB = Isobutyl Isobutyrate;
Basic Quencher = tert-butyl 4-hydroxypiperidine-1-carboxylate solution (1 wt %) in IBIB.

Contact Angle Measurement

Static contact angle (SCA), receding contact angle (RCA), advancing contact angle (ACA) and sliding angle (SA) with respect to DI water were measured for each resist overcoat composition. Static and dynamic contact angles were measured using a KRUSS drop shape analyzer model 100. For dynamic contact angle measurement, the droplet size of DI water was 50 µl (microliter), and the wafer stage tilting rate was 1 unit/sec. Once a water droplet was placed on a test wafer surface, the wafer stage started to tilt immediately. During wafer stage tilting, video of the droplet was taken at a rate of 20 frames per second until the droplet slid away from its original location. Each frame in the video was then analyzed, and the image of the droplet on the frame when the droplet just started to slide was used to determine the dynamic contact angles (receding and advancing) by their corresponding tangent lines. Sliding angle is the wafer stage tilting angle corresponding to the frame when the droplet just started to slide. In static contact angle measurement, the water droplet was 2.5 µl and placed on the test wafer surface without tilting. The contact angle was determined by the tangent lines on both sides of the droplet. The reported static contact angle was the average of the contact angles from left and right sides of the droplet. Surface energy was calculated based on the static contact angles of water using the Extended Fowkes theory. The results for contact angle (SCA), receding contact angle (RCA), advancing contact angle (ACA), sliding angle (SA) and the difference in RCA with respect to OC-1 (ΔRCA from OC-1) are set forth in Table 3.

TABLE 3

| Sample | SCA (°) | RCA (°) | ACA (°) | SA (°) | ΔRCA from OC-1 (°) |
|---|---|---|---|---|---|
| OC-1 (Comp) | 83.2 | 74.8 | 91.6 | 14.4 | — |
| OC-2 | 88.0 | 78.6 | 97.4 | 18.7 | 3.8 |
| OC-3 | 88.8 | 79.8 | 97.8 | 17.3 | 5.0 |
| OC-4 | 88.9 | 80.4 | 97.4 | 16.5 | 5.6 |
| OC-5 | 91.1 | 82.2 | 100.0 | 15.6 | 7.4 |
| OC-6 | 92.9 | 84.5 | 101.3 | 14.1 | 6.7 |
| OC-7 | 92.7 | 84.9 | 100.6 | 14.2 | 10.1 |

As can be seen from Table 3, resist overcoat compositions OC-2~OC-7 containing an additive polymer in accordance with the invention exhibited favorable SCA, RCA and ACA characteristics as compared with the comparative overcoat composition OC-1, and comparable characteristics for SA.

Lithographic Process

Dry lithography was performed to examine the effect of the overcoat compositions on lithography performance. On a TEL CleanTrack ACT 8 linked to an ASML/1100 scanner, 200 mm silicon wafers were spin-coated with AR™19 bottom-antireflective coating (BARC) material (Rohm and Haas Electronic Materials, Marlborough, Mass.) and baked for 60 seconds at 205° C. to yield a film thickness of 860 Å. Photoresist composition PC-1 was coated on the BARC-coated wafers and soft-baked at 90° C. for 60 seconds on a TEL CleanTrack ACT 8 coater/developer to provide a resist layer thickness of 1000 Å. Overcoat compositions if used were coated on top of the resist and soft-baked at 90° C. for 60 seconds on a TEL CleanTrack ACT 8 coater/developer to provide a resist overcoat thickness of 290 Å. The wafers were exposed using quadrupole illumination condition with 0.75 NA, 0.89 outer sigma and 0.64 inner sigma with an ASML 1100 scanner. The exposed wafers were post-exposure baked at 90° C. for 60 seconds and developed with n-butyl acetate (NBA) developer for 30 seconds on a TEL CleanTrack ACT 8 coater/developer. The Critical dimensions (CDs) were targeted at 100 nm for dense contact holes with a 200 nm pitch at same mask features (6% PSM) and were measured at diameter of hole pattern on a Hitachi 9380 CD SEM with 200K magnification.

The following values were determined from the lithographic results: $E_s$=exposure energy to print the target CD of 100 nm for dense contact holes with a 200 nm pitch ($CD_t$); EL=exposure latitude of the photoresist, defined by the percent CD change (ΔCD) per exposure energy within ±10% of $CD_t$, according to the following formula:

$$EL=(1.1\times CD_t-0.9\times CD_t)/(E_{opt} \text{ of } 1.1\times CD_t-E_{opt} \text{ of } 0.9\times CD_t)$$

wherein EL and $CD_t$ are as defined above, and $E_{opt}$ is the optimum exposure energy to print the specified CD; FL at $E_s$=focus latitude at $E_s$, wherein focus latitude is the range of focus that keeps CD variation within ±10% of $CD_t$; PW means process window, which is the overlapping region of focus and exposure that keeps the final CD within specification or limited data area (PW was determined with KLA/Tencor Prodata™ software); PW at 5% EL=Process window in the range of ±5% CD variation; FL at underdose=focus latitude at an exposure dose of 1 mJ less than $E_s$; and FL at overdose=focus latitude at an exposure dose of 1 mJ greater than $E_s$. The results are summarized in Table 4.

TABLE 4

| Example | Overcoat Composition | $E_s$ (mJ/cm²) | EL % | PW at 5% EL (µm) | FL at $E_s$ (µm) | FL at underdose (µm) | FL at overdose (µm) |
|---|---|---|---|---|---|---|---|
| 1 (Comp) | N/A | 25.8 | 9.8 | 0.31 | 0.40 | 0.40 | 0.30 |
| 2 (Comp) | OC-1 | 26.3 | 13.0 | 0.46 | 0.50 | 0.60 | 0.30 |
| 3 | OC-2 | 27.1 | 11.9 | 0.39 | 0.45 | 0.50 | 0.30 |
| 4 | OC-3 | 26.5 | 12.1 | 0.42 | 0.45 | 0.50 | 0.30 |
| 5 | OC-4 | 26.4 | 11.5 | 0.43 | 0.45 | 0.55 | 0.30 |

TABLE 4-continued

| Example | Overcoat Composition | $E_s$ (mJ/cm$^2$) | EL % | PW at 5% EL (µm) | FL at $E_s$ (µm) | FL at underdose (µm) | FL at overdose (µm) |
|---|---|---|---|---|---|---|---|
| 6 | OC-5 | 26.6 | 12.3 | 0.42 | 0.45 | 0.60 | 0.35 |
| 7 | OC-6 | 26.5 | 11.8 | 0.42 | 0.45 | 0.60 | 0.40 |
| 8 | OC-7 | 27.4 | 11.1 | 0.39 | 0.40 | 0.50 | 0.30 |

As can be seen from Table 4, the lithographic performance for the examples using a resist overcoat in accordance with the invention provided good overall lithographic performance.

Preparation of Resist Overcoat Compositions (OC)

Resist overcoat compositions are prepared by dissolving 9 g matrix polymer, 0.95 g additive polymer and 0.05 g tert-butyl 4-hydroxypiperidine-1-carboxylate in 990 g of a solvent using the components set forth in Table 5. The resulting mixtures are rolled on a mechanical roller for three hours and are then filtered through a Teflon filter having a 0.2 micron pore size.

TABLE 5

| Overcoat composition | Matrix Polymer | Additive Polymer | Basic Quencher | Solvent |
|---|---|---|---|---|
| OC-9 | MP-2 | AP-5 | TB-4HP | IBIB |
| OC-10 | MP-3 | AP-6 | TB-4HP | IBIB |
| OC-11 | MP-4 | AP-6 | TB-4HP | NHP |
| OC-12 | MP-5 | AP-7 | TB-4HP | NHP |
| OC-13 | MP-6 | AP-3 | TIPA | IBIB |
| OC-14 | MP-7 | AP-3 | TIPA | IBIB |
| OC-15 | MP-8 | AP-8 | TIPA | NHP |
| OC-16 | MP-9 | AP-3 | TIPA | NHP |
| OC-17 | MP-10 | AP-8 | TBMA | IBIB |
| OC-18 | MP-11 | AP-9 | TBMA | IBIB |
| OC-19 | MP-12 | AP-10 | TBMA | IBIB |
| OC-20 | MP-13 | AP-3 | TBMA | IBIB |
| OC-21 | MP-14 | AP-11 | TBMA | IBIB |
| OC-22 | MP-15 | AP-12 | TBMA | IBIB |
| OC-23 | MP-16 | AP-10 | TBDA | NHP |
| OC-24 | MP-17 | AP-11 | TBDA | NHP |
| OC-25 | MP-18 | AP-5 | TBDA | NHP |
| OC-26 | MP-19 | AP-13 | TBDA | IBIB |
| OC-27 | MP-20 | AP-14 | TBDA | IBIB |

TB-4HP = tert-butyl 4-hydroxypiperidine-1-carboxylate;
TIPA = triisopropanolamine;
TBMA = N1,N1,N3,N3-tetrabutylmalonamide;
TBDA = n-tert-butyldiethanolamine;
IBIB = Isobutyl Isobutyrate; and
NHP = n-heptyl propionate.

Matrix Polymers

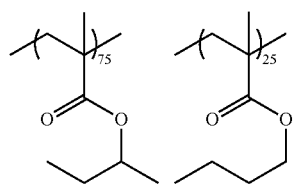

MP-1

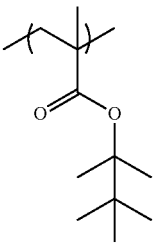

MP-2

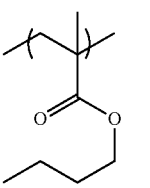

MP-3

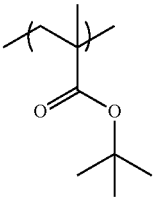

MP-4

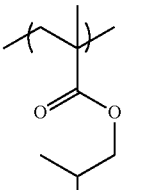

MP-5

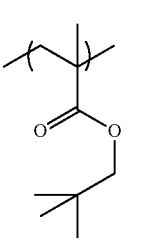

MP-6

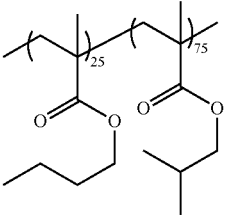

MP-7

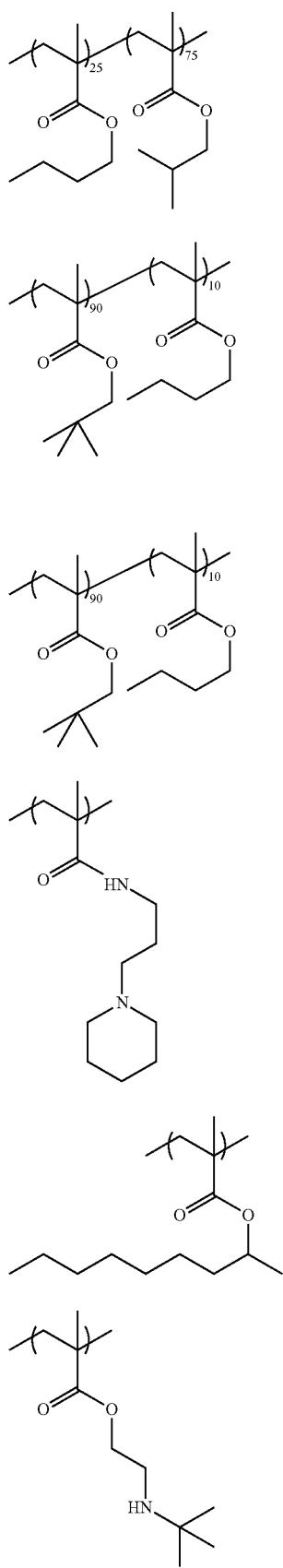
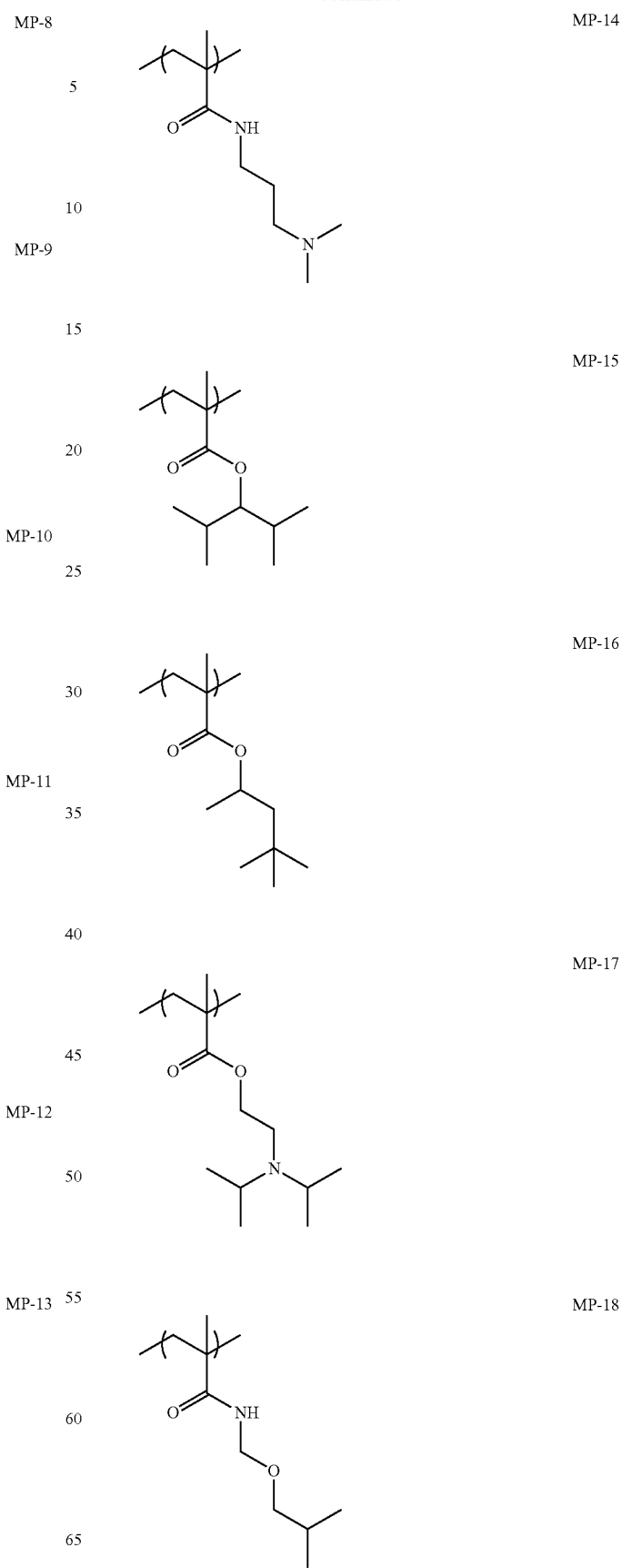

MP-19
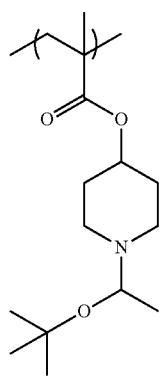
MP-20
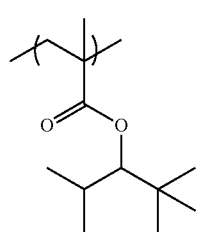
Additive Polymers
AP-1
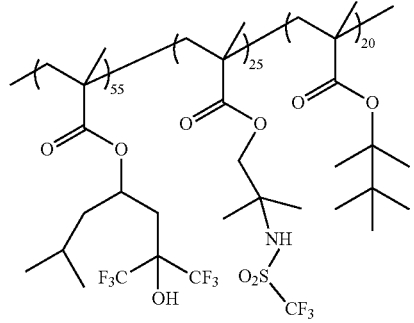
AP-2
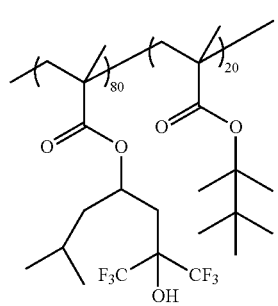
AP-3
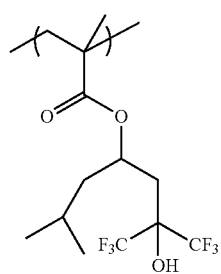
AP-4
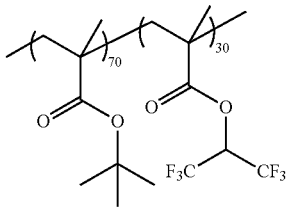
AP-5
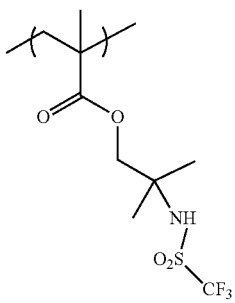
AP-6
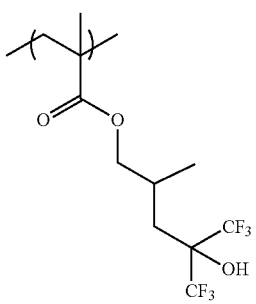
AP-7
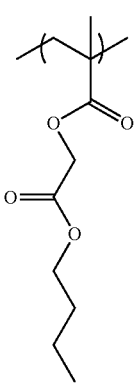
AP-8
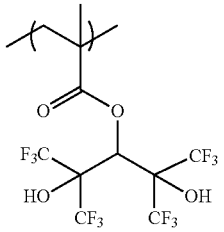

-continued

AP-9
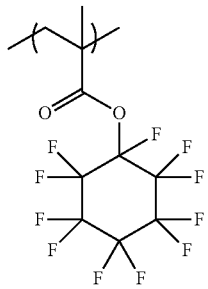

AP-10
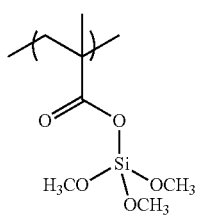

AP-11
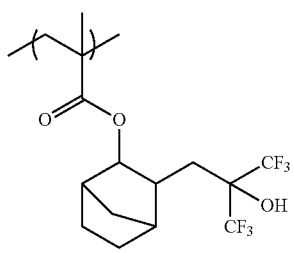

AP-12
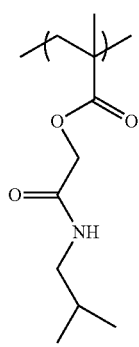

AP-13
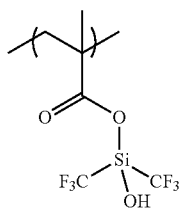

AP-14
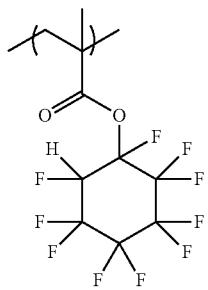

Lithographic Process 300 mm silicon wafers are spin-coated with AR™19 bottom-antireflective coating (BARC) material (Rohm and Haas Electronic Materials, Marlborough, Mass.) and baked for 60 seconds at 205° C. to yield a film thickness of 860 Å. Photoresist composition PC-1 is spin-coated on the BARC-coated wafers and soft-baked at 90° C. for 60 seconds to provide a resist layer thickness of 1000 Å. The overcoat compositions in Table 5 are spin-coated on top of the resist and soft-baked at 90° C. for 60 seconds to provide a resist overcoat layer. The wafers are exposed on an immersion scanner and then developed using 2-heptanone for 25 seconds on a spin-coater to give negative tone patterns.

What is claimed is:

1. A photoresist overcoat composition, comprising:
a matrix polymer comprising a unit formed from a monomer of the following general formula (I):

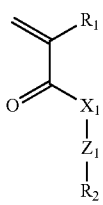

(I)

wherein: $R_1$ is chosen from hydrogen and optionally substituted C1 to C3 alkyl; $R_2$ is chosen from optionally substituted C1 to C15 alkyl; $X_1$ is oxygen, sulfur or is represented by the formula $NR_3$, wherein $R_3$ is chosen from hydrogen and optionally substituted C1 to C10 alkyl; and $Z_1$ is a single bond or a spacer unit chosen from optionally substituted aliphatic and aromatic hydrocarbons, and combinations thereof, optionally with one or more linking moiety chosen from —O—, —S—, —COO— and —CONR$_4$— wherein $R_4$ is chosen from hydrogen and optionally substituted C1 to C10 alkyl; and an additive polymer comprising a unit formed from a monomer of the following general formula (II):

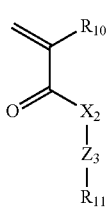

(II)

wherein: $R_{10}$ is chosen from hydrogen and optionally substituted C1 to C3 alkyl; $R_{11}$ is chosen from optionally substituted C1 to C15 alkyl; $X_2$ is oxygen, sulfur or is represented by the formula $NR_{12}$, wherein $R_{12}$ is chosen from hydrogen and optionally substituted C1 to C10 alkyl; and $Z_3$ is a single bond or a spacer unit chosen from optionally substituted aliphatic and aromatic hydrocarbons, and combinations thereof, optionally with one or more linking moiety chosen from —O—, —S—, —NHSO$_2$—, —COO— and —CONR$_{13}$— wherein R$_{13}$ is chosen from hydrogen and optionally substituted C1 to C10 alkyl;

a basic quencher; and an organic solvent;

wherein the additive polymer has a lower surface energy than a surface energy of the matrix polymer, and wherein the additive polymer is present in the overcoat composition in an amount of from 1 to 20 wt % based on total solids of the overcoat composition; and wherein the composition is free of photoacid generator compounds.

2. The photoresist overcoat composition of claim 1, wherein the additive polymer comprises a unit containing a fluorine atom.

3. The photoresist overcoat composition of claim 2, wherein the additive polymer comprises a unit containing a fluoroalcohol.

4. The photoresist overcoat composition of claim 1, wherein the matrix polymer is free of fluorine and silicon.

5. The photoresist overcoat composition of claim 1, wherein the basic quencher comprises a basic moiety on the matrix polymer.

6. The photoresist overcoat composition of claim 1, wherein the basic quencher is an additive separate from the additive polymer and the matrix polymer.

7. The photoresist overcoat composition of claim 1, wherein the additive polymer is present in the overcoat composition in an amount of from 3 to 15 wt % based on total solids of the overcoat composition.

8. The photoresist overcoat composition of claim 1, wherein the matrix polymer is present in the overcoat composition in an amount of from 70 to 99 wt % based on total solids of the overcoat composition.

9. A photoresist overcoat composition, comprising:

a matrix polymer comprising a unit formed from a monomer of the following general formula (I):

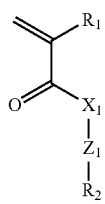

(I)

wherein: R$_1$ is chosen from hydrogen and optionally substituted C1 to C3 alkyl; R$_2$ is chosen from optionally substituted C1 to C15 alkyl; X$_1$ is oxygen, sulfur or is represented by the formula NR$_3$ wherein R$_3$ is chosen from hydrogen and optionally substituted C1 to C10 alkyl; and Z$_1$ is a single bond or a spacer unit chosen from optionally substituted aliphatic and aromatic hydrocarbons, and combinations thereof, optionally with one or more linking moiety chosen from —O—, —S—, —COO— and —CONR$_4$— wherein R$_4$ is chosen from hydrogen and optionally substituted C1 to C10 alkyl; and an additive polymer comprising a unit formed from a monomer of the following general formula (III):

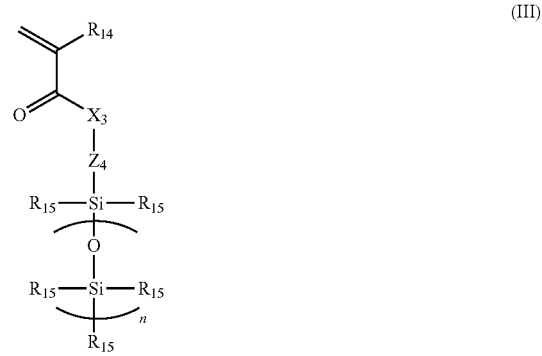

(III)

wherein: R$_{14}$ is chosen from hydrogen and optionally substituted C1 to C3 alkyl; R$_{15}$ is independently chosen from optionally substituted C1 to C15 alkyl; X$_3$ is oxygen, sulfur or is represented by the formula NR$_{16}$, wherein R$_{16}$ is chosen from hydrogen and optionally substituted C1 to C10 alkyl; Z$_4$ is a single bond or a spacer unit chosen from optionally substituted aliphatic and aromatic hydrocarbons, and combinations thereof, optionally with one or more linking moiety chosen from —O—, —S—, —COO— and —CONR$_{17}$—, wherein R$_{17}$ is chosen from hydrogen and optionally substituted C1 to C10 alkyl; and n is an integer from 0 to 2;

a basic quencher; and an organic solvent;

wherein the additive polymer has a lower surface energy than a surface energy of the matrix polymer, and wherein the additive polymer is present in the overcoat composition in an amount of from 1 to 20 wt % based on total solids of the overcoat composition.

10. The photoresist overcoat composition of claim 9, wherein the additive polymer comprises a unit containing a fluorine atom.

11. The photoresist overcoat composition of claim 9, wherein the additive polymer comprises a unit containing a fluoroalcohol.

12. The photoresist overcoat composition of claim 9, wherein the matrix polymer is free of fluorine and silicon.

13. The photoresist overcoat composition of claim 9, wherein the basic quencher comprises a basic moiety on the matrix polymer.

14. The photoresist overcoat composition of claim 9, wherein the basic quencher is an additive separate from the additive polymer and the matrix polymer.

15. The photoresist overcoat composition of claim 9, wherein the additive polymer is present in the overcoat composition in an amount of from 3 to 15 wt % based on total solids of the overcoat composition.

16. The photoresist overcoat composition of claim 9, wherein the matrix polymer is present in the overcoat composition in an amount of from 70 to 99 wt % based on total solids of the overcoat composition.

17. The photoresist overcoat composition of claim 9, wherein the composition is free of photoacid generator compounds.

18. A photoresist overcoat composition, comprising:

a matrix polymer comprising a unit formed from a monomer of the following general formula (I):

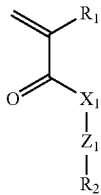

(I)

wherein: $R_1$ is chosen from hydrogen and optionally substituted C1 to C3 alkyl; $R_2$ is chosen from optionally substituted C1 to C15 alkyl; $X_1$ is oxygen, sulfur or is represented by the formula $NR_3$, wherein $R_3$ is chosen from hydrogen and optionally substituted C1 to C10 alkyl; and $Z_1$ is a single bond or a spacer unit chosen from optionally substituted aliphatic and aromatic hydrocarbons, and combinations thereof, optionally with one or more linking moiety chosen from —O—, —S—, —COO— and —CONR$_4$— wherein $R_4$ is chosen from hydrogen and optionally substituted C1 to C10 alkyl; and an additive polymer comprising a unit formed from a monomer of the following general formula (II): or (III):

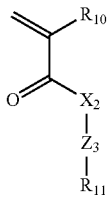

(II)

wherein: $R_{10}$ is chosen from hydrogen and optionally substituted C1 to C3 alkyl; $R_{11}$ is chosen from optionally substituted C1 to C15 alkyl; $X_2$ is oxygen, sulfur or is represented by the formula $NR_{12}$, wherein $R_{12}$ is chosen from hydrogen and optionally substituted C1 to C10 alkyl; and $Z_3$ is a single bond or a spacer unit chosen from optionally substituted aliphatic and aromatic hydrocarbons, and combinations thereof, optionally with one or more linking moiety chosen from —O—, —S—, —NHSO$_2$—, —COO— and —CONR$_{13}$— wherein $R_{13}$ is chosen from hydrogen and optionally substituted C1 to C10 alkyl;

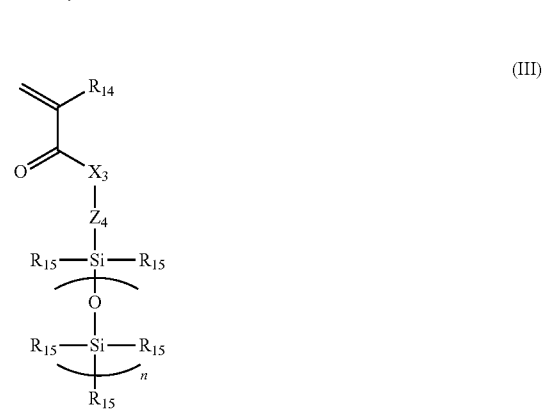

(III)

wherein: $R_{14}$ is chosen from hydrogen and optionally substituted C1 to C3 alkyl; $R_{15}$ is independently chosen from optionally substituted C1 to C15 alkyl; $X_3$ is oxygen, sulfur or is represented by the formula $NR_{16}$, wherein $R_{16}$ is chosen from hydrogen and optionally substituted C1 to C10 alkyl; $Z_4$ is a single bond or a spacer unit chosen from optionally substituted aliphatic and aromatic hydrocarbons, and combinations thereof, optionally with one or more linking moiety chosen from —O—, —S—, —COO— and —CONR$_{17}$—, wherein $R_{17}$ is chosen from hydrogen and optionally substituted C1 to C10 alkyl; and n is an integer from 0 to 2;

a basic quencher; and an organic solvent;

wherein the additive polymer has a lower surface energy than a surface energy of the matrix polymer, and wherein the additive polymer is present in the overcoat composition in an amount of from 1 to 20 wt % based on total solids of the overcoat composition; and wherein the additive polymer comprises a unit containing a fluorine atom.

19. The photoresist overcoat composition of claim 18, wherein the additive polymer comprises a unit containing a fluoroalcohol.

* * * * *